United States Patent
Chen et al.

(10) Patent No.: US 9,231,153 B2
(45) Date of Patent: Jan. 5, 2016

(54) MICRO-LIGHT-EMITTING DIODE

(71) Applicant: MIKRO MESA TECHNOLOGY CO., LTD., Apia (WS)

(72) Inventors: Li-Yi Chen, Tainan (TW); Pei-Yu Chang, Tainan (TW); Chih-Hui Chan, Tainan (TW); Chun-Yi Chang, Tainan (TW); Shih-Chyn Lin, Tainan (TW); Hsin-Wei Lee, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 14/701,514

(22) Filed: Apr. 30, 2015

(65) Prior Publication Data

US 2015/0349200 A1     Dec. 3, 2015

Related U.S. Application Data

(63) Continuation-in-part of application No. 14/290,999, filed on May 30, 2014, now Pat. No. 9,105,813.

(51) Int. Cl.
   *H01L 21/00*     (2006.01)
   *H01L 33/14*     (2010.01)
   *H01L 33/62*     (2010.01)
   *H01L 33/40*     (2010.01)
   *H01L 33/42*     (2010.01)
   *H01L 33/38*     (2010.01)

(52) U.S. Cl.
CPC .............. *H01L 33/14* (2013.01); *H01L 33/145* (2013.01); *H01L 33/38* (2013.01); *H01L 33/405* (2013.01); *H01L 33/42* (2013.01); *H01L 33/62* (2013.01)

(58) Field of Classification Search
CPC ....... H01L 33/14; H01L 33/145; H01L 33/62; H01L 33/405; H01L 33/42; H01L 33/38
See application file for complete search history.

(56) References Cited

U.S. PATENT DOCUMENTS

| | | | |
|---|---|---|---|
| 6,410,942 B1 * | 6/2002 | Thibeault | H01L 33/08 257/88 |
| 2006/0169993 A1 * | 8/2006 | Fan | H01L 27/153 257/88 |
| 2013/0126081 A1 * | 5/2013 | Hu | H01L 24/83 156/249 |

FOREIGN PATENT DOCUMENTS

| | | |
|---|---|---|
| CN | 1346154 A | 4/2002 |
| CN | 102074635 A | 5/2011 |
| JP | H08340132 A | 12/1996 |

\* cited by examiner

*Primary Examiner* — Richard Booth
(74) *Attorney, Agent, or Firm* — CKC & Partners Co., Ltd.

(57) ABSTRACT

A micro-light-emitting diode (micro-LED) includes a first type semiconductor layer, a second type semiconductor, a first current controlling layer, a first electrode, and a second electrode. The second type semiconductor layer and the first current controlling layer are joined with the first type semiconductor layer. The first current controlling layer has at least one opening therein. The first electrode is electrically coupled with the first type semiconductor layer through the opening. The second electrode is electrically coupled with the second type semiconductor layer. At least one of the first electrode and the second electrode has a light-permeable part. A vertical projection of the first current controlling layer on said one of the first electrode and the second electrode overlaps with the light-permeable part. The light-permeable part is transparent or semi-transparent.

30 Claims, 22 Drawing Sheets

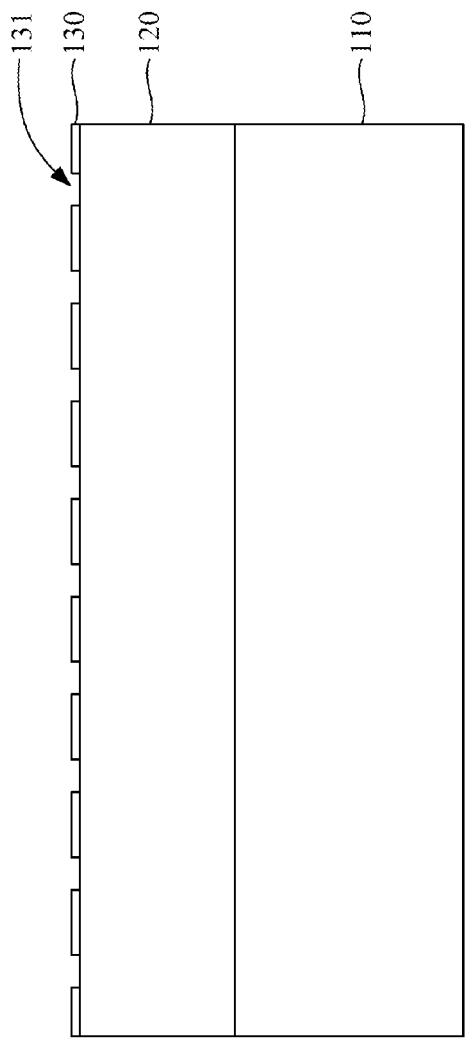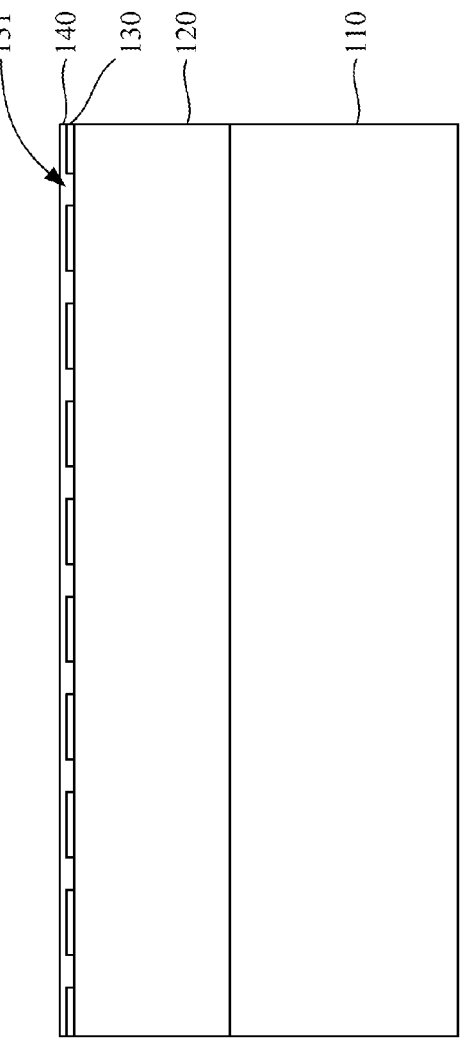

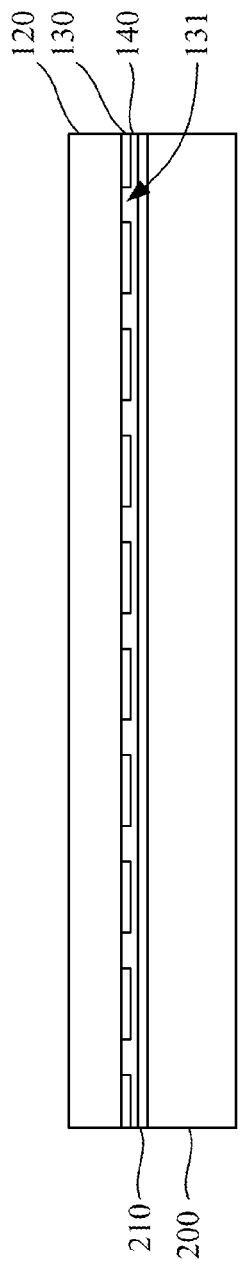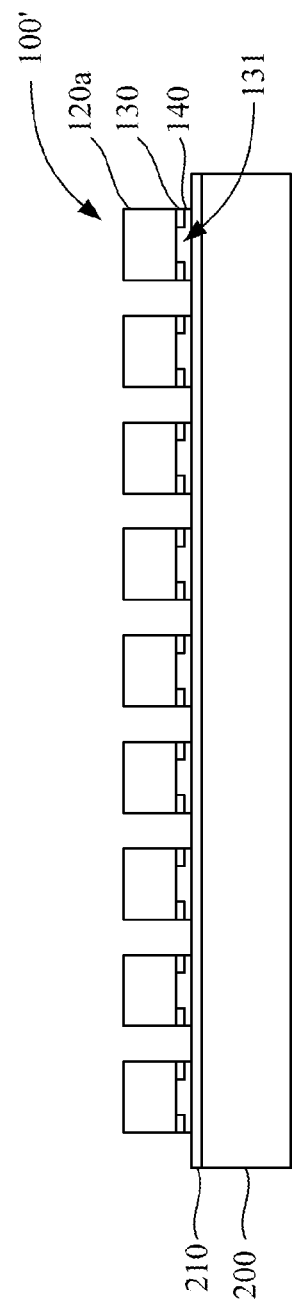

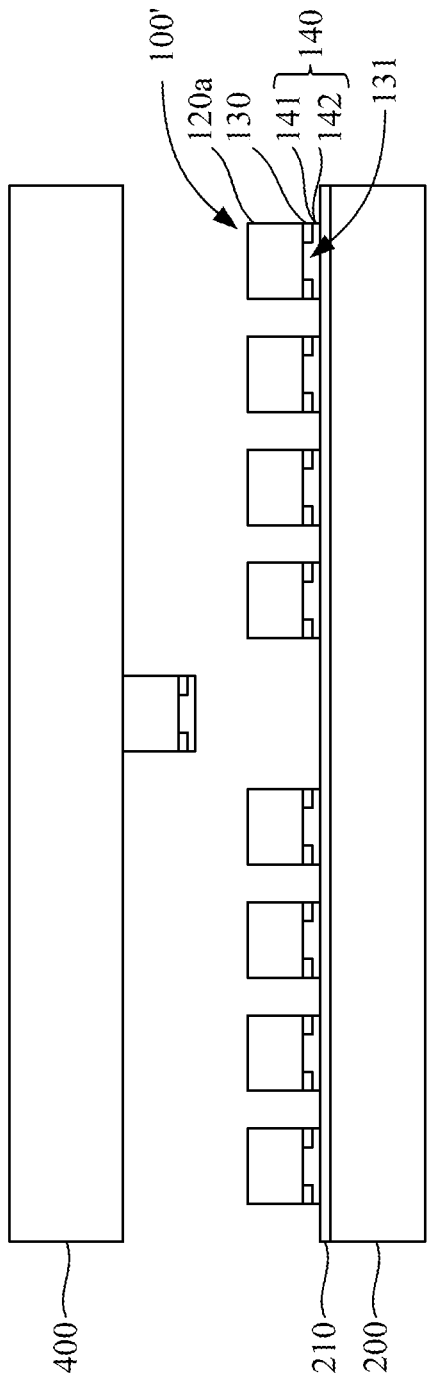

MICRO-LIGHT-EMITTING DIODE

RELATED APPLICATIONS

The present application is a continuation-in-part of U.S. application Ser. No. 14/290,999, filed May 30, 2014, which is herein incorporated by reference.

BACKGROUND

1. Technical Field

The present disclosure relates to micro-light-emitting diodes (micro-LEDs).

2. Description of Related Art

In the recent years, light-emitting diodes (LEDs) have become popular in general and commercial lighting applications. As light sources, LEDs have many advantages including lower energy consumption, longer lifetime, smaller size, and faster switching, and hence conventional lighting, such as incandescent lighting, is gradually replaced by LED lights. In an LED, when electrons and holes recombine across the semiconductor gap, the recombination energy is emitted in the form of photons and generates light. This recombination mechanism is the so-called radiative recombination.

In an LED display which uses micro-size LED arrays, in order to provide an adequate brightness (e.g., about 500 nits-1000 nits), the average emitting energy of each of the LEDs usually must be decreased. Otherwise, the brightness of the LED display will be too high. To control the emitting energy and maintaining the efficiency and uniformity of the display are important.

SUMMARY

According to one embodiment of this invention, a micro-light-emitting diode (micro-LED) includes a first type semiconductor layer, a second type semiconductor layer, a first current controlling layer, a first electrode, and a second electrode. The second type semiconductor layer is joined with the first type semiconductor layer. The first current controlling layer is joined with the first type semiconductor layer. The first current controlling layer has at least one opening therein. The first electrode is electrically coupled with the first type semiconductor layer. The second electrode is electrically coupled with the second type semiconductor layer. At least one of the first electrode and the second electrode has a light-permeable part. A vertical projection of the first current controlling layer on said one of the first electrode and the second electrode overlaps with the light-permeable part. The light-permeable part is transparent or semi-transparent.

In an embodiment of the invention, a vertical projection of the opening of the first current controlling layer on said one of the first electrode and the second electrode overlaps with the light-permeable part.

In an embodiment of the invention, the first current controlling layer is a dielectric layer.

In an embodiment of the invention, the first type semiconductor layer and the second type semiconductor layer form a first p-n junction. The first current controlling layer and the first type semiconductor layer form a second p-n junction. The first electrode and the second electrode are configured to forward bias the first p-n junction while reverse bias the second p-n junction.

In an embodiment of the invention, the first type semiconductor layer is a p type semiconductor layer, and the second type semiconductor layer and the first current controlling layer are n type semiconductor layers.

In an embodiment of the invention, the first type semiconductor layer is an n type semiconductor layer, and the second type semiconductor layer and the first current controlling layer are p type semiconductor layers.

In an embodiment of the invention, the first type semiconductor layer and the second type semiconductor layer form a p-n junction, and the first current controlling layer and the first type semiconductor layer form a Schottky barrier.

In an embodiment of the invention, the first current controlling layer is a plasma-treated portion of the first type semiconductor layer.

In an embodiment of the invention, the first type semiconductor layer has a resistivity $\rho_1$, the first current controlling layer is a high resistivity layer which has a resistivity $\rho_h$, and $\rho_h > \rho_1$.

In an embodiment of the invention, the first current controlling layer is an electron blocking layer, and the first type semiconductor layer is an n type semiconductor layer.

In an embodiment of the invention, the first current controlling layer is a hole blocking layer, and the first type semiconductor layer is a p type semiconductor layer.

In an embodiment of the invention, a micro-LED display includes a substrate and the micro-LED. The substrate has a bonding electrode. A combination of the first type semiconductor layer, the second type semiconductor layer, the first current controlling layer, the first electrode, and the second electrode is joined with the bonding electrode. The first type semiconductor layer is distal to the substrate, and the second type semiconductor layer is proximal to the substrate.

In an embodiment of the invention, a micro-LED display includes a substrate and the micro-LED. A combination of the first type semiconductor layer, the second type semiconductor layer, the first current controlling layer, the first electrode, and the second electrode is joined with the substrate. The first type semiconductor layer is distal to the substrate, and the second type semiconductor layer is proximal to the substrate. The second electrode serves as a bonding electrode of the substrate.

In an embodiment of the invention, the first current controlling layer is transparent or monochrome transparent.

In an embodiment of the invention, the first current controlling layer is reflective or monochrome reflective.

In an embodiment of the invention, a micro-LED display includes a substrate and the micro-LED. The substrate has a bonding electrode. A combination of the first type semiconductor layer, the second type semiconductor layer, the first current controlling layer, the first electrode, and the second electrode is joined with the bonding electrode. The first type semiconductor layer is proximal to the substrate, and the second type semiconductor layer is distal to the substrate.

In an embodiment of the invention, a micro-LED display includes a substrate and the micro-LED. A combination of the first type semiconductor layer, the second type semiconductor layer, the first current controlling layer, the first electrode, and the second electrode is joined with the substrate. The first type semiconductor layer is proximal to the substrate, the second type semiconductor layer is distal to the substrate, and the first electrode serves as a bonding electrode of the substrate.

In an embodiment of the invention, said one of the first electrode and the second electrode having the light-permeable part is wholly transparent.

In an embodiment of the invention, the first current controlling layer has a plurality of the openings therein.

In an embodiment of the invention, the first electrode is electrically coupled with the first type semiconductor layer through the opening of the first current controlling layer.

In an embodiment of the invention, current spreading length of lateral direction is proportional to $$\sqrt{\frac{t}{\rho}},$$

where the t is the thickness of the layer and ρ is the resistivity value of the layer. The first type semiconductor layer has a resistivity ρ1 and a thickness $t_1$, the second type semiconductor layer has a resistivity $\rho_2$ and a thickness $t_2$, and $$\sqrt{\frac{t_1}{\rho_1}} < \sqrt{\frac{t_2}{\rho_2}}.$$

In an embodiment of the invention, the micro-LED further includes a second current controlling layer. The second current controlling layer is joined with the second type semiconductor layer and has at least one opening therein. The second electrode extends through the opening of the second current controlling layer to be electrically coupled with the second type semiconductor layer.

In an embodiment of the invention, the first electrode at least partially covers the opening of the first current controlling layer.

In an embodiment of the invention, the second electrode at least partially contacts the second type semiconductor layer.

In an embodiment of the invention, the first electrode at least partially contacts the first type semiconductor layer.

In an embodiment of the invention, the micro-LED further includes an active layer. The active layer is disposed between the first type semiconductor layer and the second type semiconductor layer. The first current controlling layer is disposed between at least a part of the first type semiconductor layer and the active layer.

In an embodiment of the invention, the first current controlling layer contacts the active layer.

In an embodiment of the invention, the first current controlling layer is disposed in the first type semiconductor layer without contacting the active layer.

In an embodiment of the invention, the micro-LED further includes a second current controlling layer. The second current controlling layer is disposed between at least a part of the second type semiconductor layer and the active layer.

In an embodiment of the invention, the micro-LED further includes a second current controlling layer. The second current controlling layer is joined with the second type semiconductor layer and has at least one opening therein. The second electrode extends through the opening of the second current controlling layer to be electrically coupled with the second type semiconductor layer.

The opening can control most of the current flow into a certain area of the active layer. When the micro-LED is forward biased, charge carriers flow from the opening to the junction of the first type semiconductor layer and the second type semiconductor layer. Since the opening makes the emitting area limited in the region of active layer which the current passes through. Thus we can make a micro-LED which has a smaller light emitting region than that of the micro-LED without the current controlling layer and the opening therein, it is possible to continue miniaturization of the emitting area of the micro-LED while remain the size of the micro-LED to allow the micro-LED to be manufactured with acceptable yield rate. In addition, transferring, controlling, operating, and handling of the micro-LEDs will become easier.

Furthermore, since the opening limits the area where the current goes into the micro-LED, the emitting area of the micro-LED can be decreased to be smaller than the area of the active layer so as to provide an adequate brightness, and the current density within the emitting area of the micro-LED increases and can be more uniform, thereby increasing the efficiency of the micro-LED.

BRIEF DESCRIPTION OF THE DRAWINGS

FIG. 2C is a cross-sectional side view illustration of a patterned current controlling layer formed on the p-n diode layer in FIG. 2A according to an embodiment of the invention;

FIG. 2D is a cross-sectional side view illustration of a first conductive layer formed on the patterned current controlling layer in FIG. 2C according to an embodiment of the invention;

FIG. 2G is a cross-sectional side view illustration of removing the growth substrate from the bonded structure in FIG. 2F and thinning-down the p-n diode layer according to an embodiment of the invention;

FIG. 2H is a cross-sectional side view illustration of etching the p-n diode layer and the first conductive layer in FIG. 2G to form micro p-n diodes according to an embodiment of the invention;

FIG. 2I is a cross-sectional side view illustration of a transfer head picking up a micro-LED from the carrier substrate in FIG. 2H according to an embodiment of the invention;

DETAILED DESCRIPTION

Figure 1:
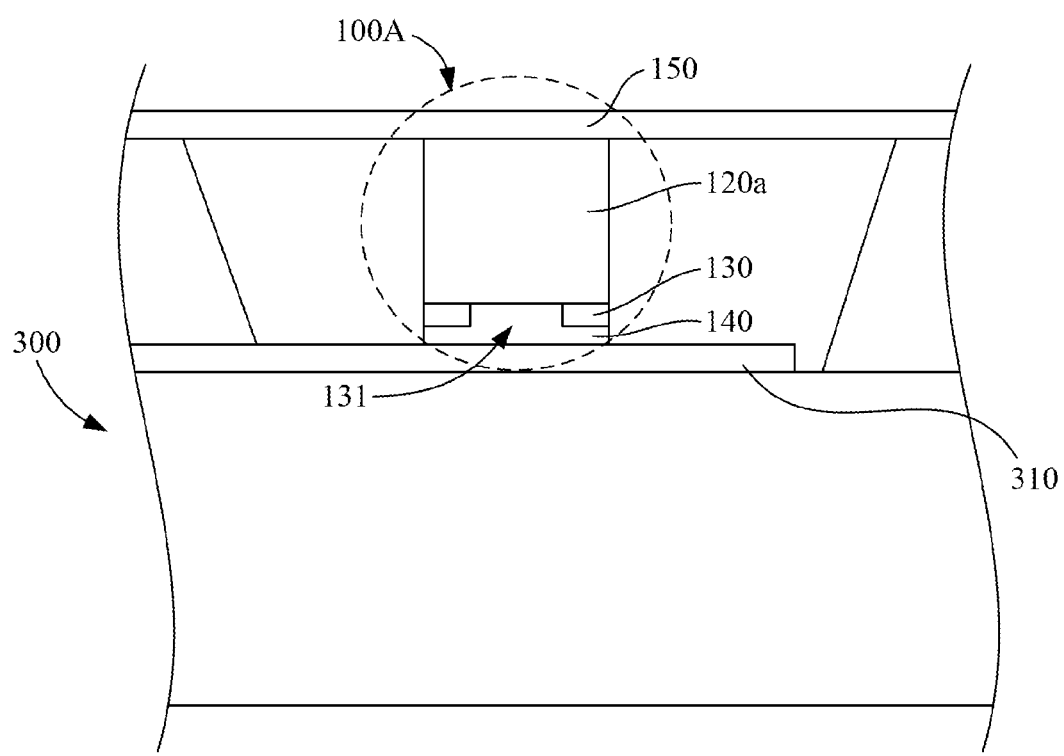
FIG. 1 is a cross-sectional view of a micro-light-emitting diode (micro-LED) disposed on a receiving substrate according to an embodiment of this invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Embodiments of the present invention describe micro semiconductor devices and a method of forming an array of micro semiconductor devices such as micro-light-emitting diodes (micro-LEDs) for transfer to a receiving substrate. For example, the receiving substrate may be, but is not limited to, a display substrate.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "in an embodiment" or the like in various places throughout this specification are not necessarily referring to the same embodiment of the invention. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "micro" device, "micro" p-n diode or "micro" LED structure as used herein may refer to the descriptive size of certain devices or structures according to embodiments of the invention. As used herein, the terms "micro" devices or structures are meant to refer to the scale of 1 to 100 µm. However, it is to be appreciated that embodiments of the present invention are not necessarily so limited, and that certain aspects of the embodiments may be applicable to larger, and possibly smaller size scales.

Some embodiments of the invention describe a method of processing a bulk LED substrate into an array of micro-LEDs which are poised for pick up and transfer to a receiving substrate. In this manner, it is possible to integrate and assemble micro-LEDs into heterogeneously integrated systems. The micro-LEDs can be picked up and transferred individually, in groups, or as the entire array. Thus, the micro-LEDs in the array of micro-LEDs are poised for pick up and transfer to a receiving substrate such as display substrate of any size ranging from micro displays to large area displays, and at high transfer rates. In some embodiments, arrays of micro-LEDs which are poised for transfer are described as having a fine pitch and each micro LED has a regular octagon shape with the pitch size of 10 um. Thus a 4-inch LED epi wafer could be divided into an micro LED array which contains more than 27 million devices. Thus, a high density of pre-fabricated micro devices with a specific functionality may be produced in a manner in which they are poised for pick up and transfer to a receiving substrate.

FIG. 1 is a cross-sectional view of a micro-light-emitting diode (micro-LED) 100A disposed on a receiving substrate 300 according to an embodiment of this invention. The receiving substrate 300 is illustrated as a display substrate including a bonding electrode 310 joined with the micro-LED 100A, for example, and the details of the receiving substrate 300 can be referred to FIG. 9 and will be described in more detail in the following description. The micro-LED 100A includes a micro p-n diodes 120a, a current controlling layer 130, a first conductive layer 140, and a second conductive layer 150. The micro-LED 100A shown in FIG. 1 can be manufactured according to operations sequentially illustrated by FIG. 2C-2I, for example.

Figure 2A:
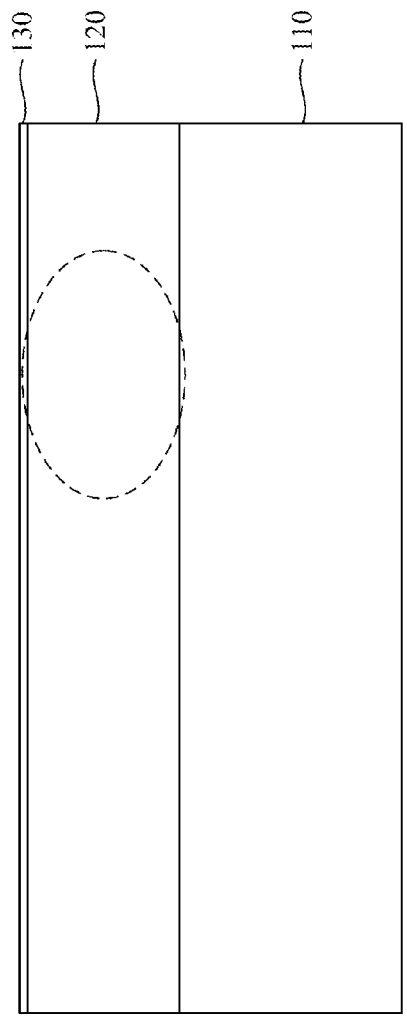
FIG. 2A is a cross-sectional side view illustration of a bulk LED substrate according to an embodiment of the invention.

FIG. 2A is a cross-sectional side view illustration of a bulk LED substrate according to an embodiment of the invention. Referring now to FIG. 2A, a semiconductor device layer 120 is formed on a growth substrate 110. In an embodiment, the semiconductor device layer 120 may not be fully functional. For example, contacts such as an anode or cathode may not yet be formed. In the interest of conciseness and to not obscure embodiments of the invention, the following description is made with regard to the semiconductor device layer 120 as a p-n diode layer 120 grown on the growth substrate 110 according to conventional heterogeneous growth conditions.

The p-n diode layer 120 may include a compound semiconductor having a bandgap corresponding to a specific region in the spectrum. For example, the p-n diode layer 120 may include one or more layers based on II-VI materials (e.g. ZnSe, ZnO) or III-V nitride materials (e.g. GaN, AlN, InN, InGaN, GaP, AlInGaP, AlGaAs and their alloys). The growth substrate 110 may include any suitable substrate such as, but not limited to, silicon, SiC, GaAs, GaN and sapphire ($Al_2O_3$).

In a particular embodiment, the growth substrate 110 is sapphire, and the p-n diode layer 120 is formed of GaN. Despite the fact that sapphire has a larger lattice constant and thermal expansion coefficient mismatch with respect to GaN, sapphire is reasonably low cost, widely available and its transparency is compatible with laser lift-off (LLO) techniques. In another embodiment, another material such as SiC may be used as the growth substrate 110 for the GaN p-n diode layer 120. Like sapphire, SiC substrates may be transparent. Several growth techniques may be used for growth of the p-n diode layer 120 such as metalorganic chemical vapor deposition (MOCVD).

Figure 2B:
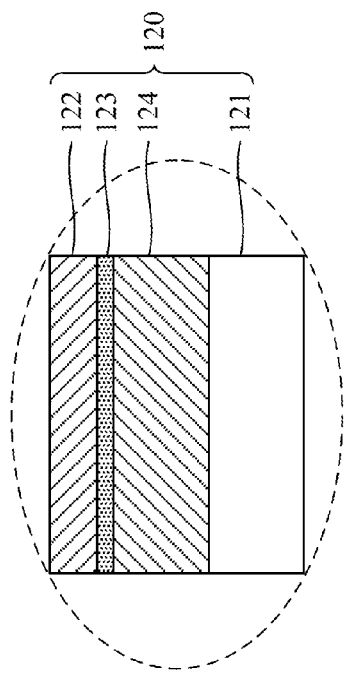
FIG. 2B is an enlarged section of the p-n diode layer in FIG. 2A.

FIG. 2B is an enlarged section of the p-n diode layer 120 in FIG. 2A. In the particular embodiment illustrated in FIG. 2B, the p-n diode layer 120 may include a first type semiconductor layer 122 (e.g., a p-doped layer), an active layer 123, a second type semiconductor layer 124 (e.g., an n-doped layer), and a buffer bulk GaN layer 121. In some embodiments, the buffer bulk GaN layer 121 is optionally not formed in the p-n diode layer 120, so the following operation of removing the buffer bulk GaN layer 121 (i.e., the operation illustrated in FIG. 2G) can be omitted. The buffer bulk GaN layer 121 may be n-doped due to silicon or oxygen contamination, or intentionally doped with a donor such as silicon. The second type semiconductor layer 124 may likewise be doped with a donor such as silicon, while first type semiconductor layer 122 may be doped with an acceptor such as magnesium. A variety of alternative p-n diode configurations may be utilized to form the p-n diode layer 120. Likewise, a simple p-n contact junction or a variety of single quantum well (SQW) or multiple quantum well (MOW) configurations may be utilized to form the active layer 123. In addition, various buffer layers may be included as appropriate. In one embodiment, the sapphire growth substrate 110 has a thickness of approximately 100 μm-400 μm, the buffer bulk GaN layer 121 has a thickness of approximately 3 μm-5 μm, the second type semiconductor layer 124 has a thickness of approximately 0.1 μm-5 μm, the active layer 123 has a thickness less than approximately 100-400 nm, and the first type semiconductor layer 122 has a thickness of approximately 100 nm-1 μm.

FIG. 2C is a cross-sectional side view illustration of a patterned current controlling layer 130 formed on the p-n diode layer 120 in FIG. 2A according to an embodiment of the invention. Referring now to FIG. 2C, a current controlling layer 130 may then be formed over the p-n diode layer 120, and a plurality of openings 131 are formed within the current controlling layer 130. In the embodiment of the invention, after a plurality of the micro-LEDs 100A are manufactured (as described in the following description), each of the micro-LEDs 100A has one opening 131, but the invention is not limited in this regard. In some embodiments, after a plurality of the micro-LEDs 100A are manufactured, each of the micro-LEDs 100A may have more than one opening 131.

FIG. 2D is a cross-sectional side view illustration of a first conductive layer 140 formed on the patterned current controlling layer 130 in FIG. 2C according to an embodiment of the invention. Referring now to FIG. 2D, a first conductive layer 140 may then be formed over the current controlling layer 130. The first conductive layer 140 is electrically coupled with the exposed parts of the first type semiconductor layer 122 of the p-n diode layer 120 through the openings 131. The first conductive layer 140 serves as an electrode layer, though other layers may be included. In an embodiment, the first conductive layer 140 has a thickness of approximately 0.1 μm-15 μm. In another embodiment, the first conductive layer 140 may also be optically transparent. Transparency may be accomplished by making the first conductive layer 140 very thin to minimize light absorption or using the transparent conductive materials. Alternatively, in some embodiments, the first conductive layer 140 is formed on the receiving substrate 300 in advance, rather than formed on the patterned current controlling layer 130 (as illustrated in FIG. 2D).

Figure 2E:
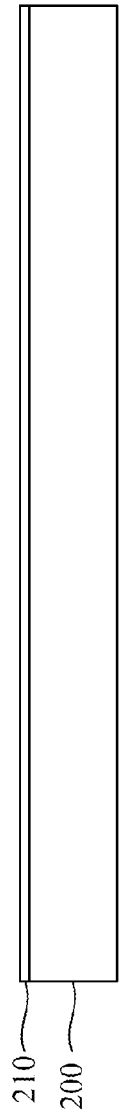
FIG. 2E is a cross-sectional side view illustration of a carrier substrate with an adhesive layer according to an embodiment of the invention.
Figure 2F:
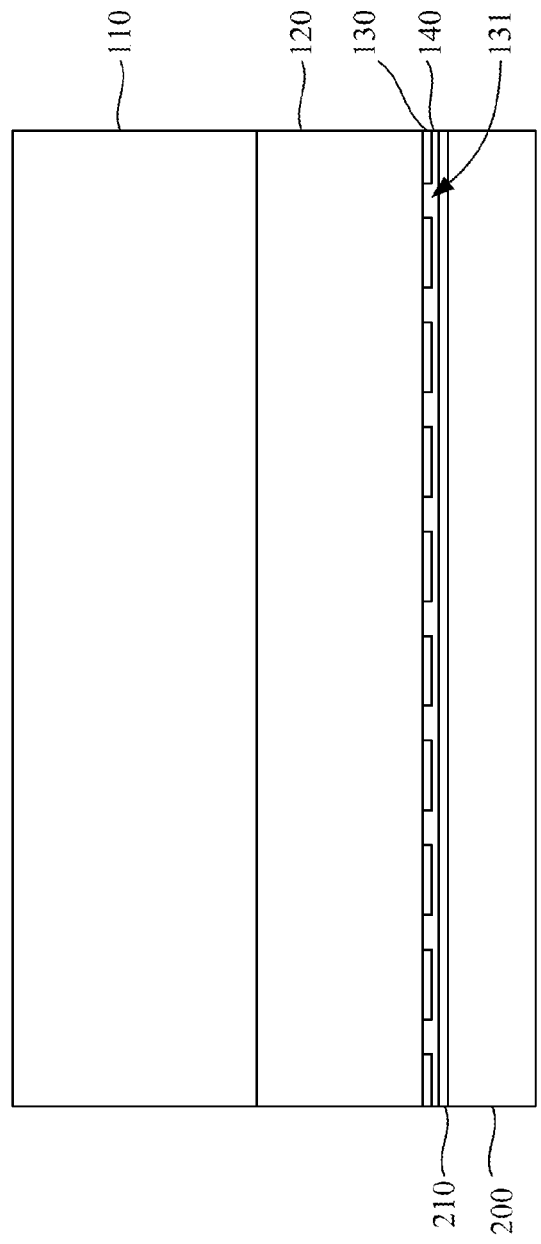
FIG. 2F is a cross-sectional side view illustration of bonding the structure of FIG. 2D and the structure of FIG. 2E together according to an embodiment of the invention.

FIG. 2E is a cross-sectional side view illustration of a carrier substrate with an adhesive layer 210 according to an embodiment of the invention. FIG. 2F is a cross-sectional side view illustration of bonding the structure of FIG. 2D and the structure of FIG. 2E together according to an embodiment of the invention. According to certain embodiments of the invention, a combination of the p-n diode layer 120, the current controlling layer 130, and the first conductive layer 140 grown on the growth substrate 110 is subsequently transferred to a carrier substrate 200 before chipped, such as one illustrated in FIG. 2F and described in more detail in the following description. In some embodiments, the first conductive layer 140 and the p-n diode layer 120 may be chipped prior to transfer to a carrier substrate 200. Accordingly, embodiments of the invention may be implemented in a multitude of variations during formation of an array of micro-LEDs 100A for subsequent transfer to the receiving substrate 300.

In an embodiment, the adhesive layer 210 may have a thickness of approximately 0.1 μm-100 μm.

The adhesive layer 210 may be made of adhesion capable organic or non-organic materials, e.g., UV curable glue or silicone. The adhesive layer 210 may be formed from a material which is capable of adhering the combination of the p-n diode layer 120, the current controlling layer 130, and the first conductive layer 140 to the carrier substrate 200. Specifically, the adhesion force of the adhesive layer 210 could be adjusted or reduced by an electric field, UV light, electromagnetic radiation, heat, ultrasound, mechanical force, pressure, or any combinations thereof. Referring now to FIG. 2F, the combination of the p-n diode layer 120, the current controlling layer 130, and the first conductive layer 140 and the carrier substrate 200 may be bonded together by using the adhesive layer 210.

FIG. 2G is a cross-sectional side view illustration of removing the growth substrate 110 from the bonded structure in FIG. 2F and thinning-down the p-n diode layer 120 according to an embodiment of the invention. Referring now to FIG. 2G, the growth substrate 110 has been removed from the bonded structure. The growth substrate 110 may be removed by a suitable method such as chemical lift-off or laser lift-off (LLO). While using LLO, the absorption in the GaN p-n diode layer 120 at the interface results in localized heating of the interface resulting in decomposition at the interfacial GaN to liquid Ga metal and nitrogen gas. Once the desired are has been irradiated, the transparent sapphire growth substrate 110 can be removed by remelting the Ga on a hotplate.

Referring now to FIG. 2G, the p-n diode layer 120 is then thinned down to a desirable thickness. Referring back to the enlarged p-n diode layer 120 in FIG. 2B, a predetermined amount of the buffer bulk GaN layer 121 (which may be n-type) or a portion of the second type semiconductor layer 124 are removed so that an operable p-n diode remains after thinning. The buffer bulk GaN layer 121 can be fully etched. Alternatively, the buffer bulk GaN layer 121 can be partially etched to form contact holes via which the second type semiconductor layer 124 can be electrically coupled with the second conductive layer 150 shown in FIG. 1. In some embodiments, the buffer bulk GaN layer 121 is optionally not formed in the p-n diode layer 120, so the operation of removing the buffer bulk GaN layer 121 (i.e., the operation illustrated in FIG. 2G) can be omitted. Depending upon the underlying structure, the thinning process may be optionally performed utilizing suitable techniques such as dry etching to etch the buffer bulk GaN layer 121.

FIG. 2H is a cross-sectional side view illustration of etching the p-n diode layer 120 and the first conductive layer 140 in FIG. 2G to form micro p-n diodes 120a according to an embodiment of the invention. Referring now to FIG. 2H, the plurality of micro p-n diodes 120a are positioned over the adhesive layer 210. In the embodiment, the micro p-n diodes 120a have vertical sidewalls. For example, ICP (Inductively Coupled Plasma) which a chlorine-based etch chemistry may be utilized to obtain vertical sidewalls.

FIG. 2I is a cross-sectional side view illustration of a transfer head 400 picking up a micro-LED 100' from the carrier substrate 200 in FIG. 2H according to an embodiment of the invention. Referring now to FIG. 2I, the micro-LEDs 100' or array of micro-LEDs 100' in FIG. 2I are poised for pick up and transfer to the receiving substrate 300 illustrated in FIG. 1, for example with a transfer head 400.

In some embodiments, the Young's modulus of the adhesive layer 210 is less than or equal to 30 GPa. As a result, the adhesive layer 210 may absorb impact forces associated with contacting the micro-LEDs 100' with a transfer head 400 during the pick up process.

Referring back to FIG. 2H, the carrier substrate 200 is provided having an array of micro-LEDs 100' disposed thereon. Each micro-LED 100' may at least include the micro p-n diode 120a, the current controlling layer 130 having at least one opening 131, and the first conductive layer 140, with the first conductive layer 140 between the current controlling layer 130 and the adhesive layer 210 on the carrier substrate 200. To transfer the micro-LED 100' to the receiving substrate 300 illustrated in FIG. 1, the adhesion force of the adhesive layer 210 is decreased by an electric field, UV light, electromagnetic radiation, heat, ultrasound, mechanical force, pressure, or any combinations thereof in advance. A combination of the micro p-n diode 120a, the current controlling layer 130, the first conductive layer 140 is then be picked up with the transfer head 400 and then placed on the receiving substrate 300.

A variety of suitable transfer heads can be utilized to aid in the pick up and placement operations according to embodiments of the invention. For example, the transfer head 400 may exert a pick up pressure on the micro-LED 100' according to vacuum, magnetic, adhesive, or electrostatic attraction in order to pick up the micro-LED 100'.

Referring back to FIG. 1 which is an illustration of the receiving substrate 300 onto which a micro-LED 100A has been placed. In the embodiment, the receiving substrate 300 is a display substrate. In the particular embodiment illustrated, the micro-LED 100' shown in FIG. 2I may be placed over the bonding electrode 310 of the receiving substrate 300. A second conductive layer 150 may then be formed over the micro p-n diode 120a, so as to form the micro-LED 100A shown in FIG. 1. In some embodiments, the second conductive layer 150 is formed from a transparent contact material such as indium tin oxide (ITO). In some embodiments, the second conductive layer 150 is in the form of a bonding wire.

In one embodiment, the p-n diode 120a may include a second type semiconductor layer 124 with a thickness of approximately 0.1 µm-50 µm, the active layer 123 (which may be SQW or MQW) with a thickness approximately 50 nm-5 µm, and the first type semiconductor layer 122 with thickness of approximately 50 nm-20 µm. In an embodiment, the second type semiconductor layer 124 may be 0.1 µm-6 µm thick (which may include or replace bulk layer 121 previously described).

Figure 3A:
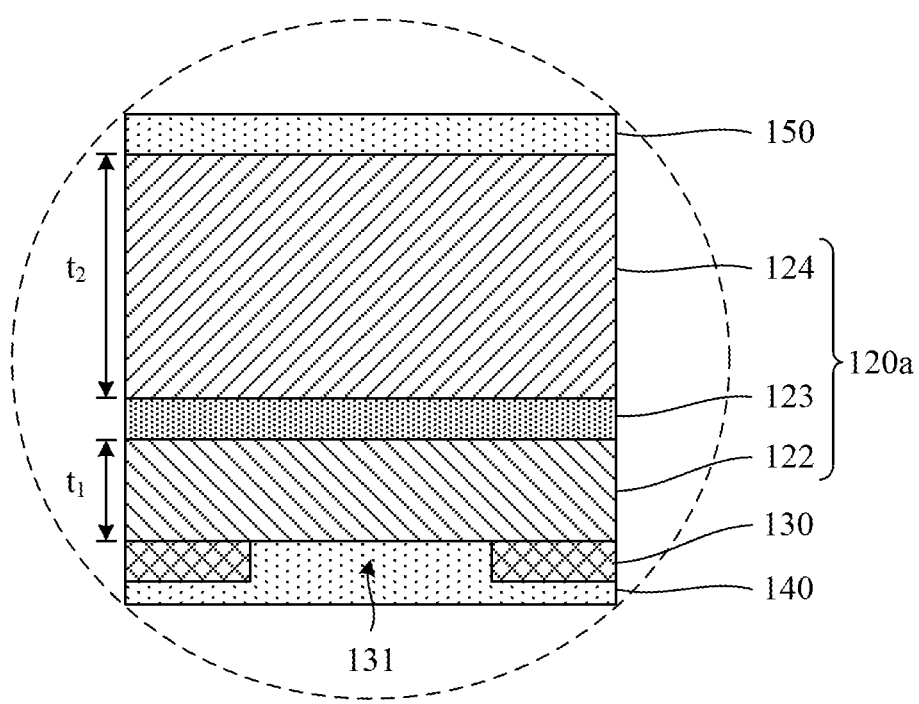
FIG. 3A is an enlarged cross-sectional view of the micro-LED in FIG. 1 according to a first embodiment of this invention.

FIG. 3A is an enlarged cross-sectional view of the micro-LED 100A in FIG. 1 according to a first embodiment of this invention. The micro-LED 100A includes a micro p-n diode 120a, a current controlling layer 130, a first conductive layer 140, and a second conductive layer 150. The micro p-n diode 120a includes a first type semiconductor layer 122, an active layer 123, and a second type semiconductor layer 124. The second type semiconductor layer 124 is joined with the first type semiconductor layer 122. The active layer 123 is disposed between the first type semiconductor layer 122 and the second type semiconductor layer 124. The current controlling layer 130 is joined with the first type semiconductor layer 122. The current controlling layer 130 has at least one opening 131 therein to expose at least one part of the first type semiconductor layer 122. The first conductive layer 140 is partially joined with the current controlling layer 130 and is electrically coupled with the exposed part of the first type semiconductor layer 122 through the opening 131 of the current controlling layer 130. The second conductive layer 150 is electrically coupled with the second type semiconductor layer 124.

Referring to FIG. 1 and FIG. 3A, in the embodiment, a combination of the first type semiconductor layer 122, the active layer 123, the second type semiconductor layer 124, the current controlling layer 130, the first conductive layer 140, and the second conductive layer 150 is joined with the bonding electrode 310 on the receiving substrate 300, so as to form a micro-LED display. In the embodiment, the first type semiconductor layer 122 is proximal to the receiving substrate 300, and the second type semiconductor layer 124 is distal to the receiving substrate 300.

In the embodiment, at least one of the first conductive layer 140 and the second conductive layer 150 has a light-permeable part. Specifically, in the embodiment, a vertical projection of the current controlling layer 130 on said one of the first conductive layer 140 and the second conductive layer 150 overlaps with the light-permeable part. The light-permeable part is transparent or semi-transparent.

In some embodiments, a vertical projection of the opening 131 of the current controlling layer 130 on said one of the first conductive layer 140 and the second conductive layer 150 overlaps with the light-permeable part.

In some embodiments, said one of the first conductive layer 140 and the second conductive layer 150 having the light-permeable part is wholly transparent.

As shown in FIG. 3A, the opening 131 of the current controlling layer 130 defines the contact interface between the first conductive layer 140 and the first type semiconductor layer 122. When the micro-LED 100A is forward biased, charge carriers flow from the contact interface between the first conductive layer 140 and the first type semiconductor layer 122 to the junction of the first type semiconductor layer 122 and the second type semiconductor layer 124 (i.e., the active layer 123).

It is noted that a conventional current blocking layer disposed in a conventional LED is used to prevent the current from flowing through the opaque portion of the electrode of the LED. That is, the location of the current blocking layer is right aligned with the opaque portion of the electrode of the LED. In order to make good use of the whole emitting area of the LED, the area of the current blocking layer must be as small as possible.

On the contrary, the micro-LED 100A of the invention uses the current controlling layer 130 to limit the emitting area of the micro-LED 100A. Compared with the conventional current blocking layer, the vertical projection of the current controlling layer 130 of the present invention on said one of the first conductive layer 140 and the second conductive layer 150 further overlaps with the light-permeable part of said one of the first conductive layer 140 and the second conductive layer 150. Since the opening 131 limits the area where the current goes into the micro-LED 100A, the current density within the emitting area of the micro-LED 100A increases and can be uniform, thereby increasing the operating stability and efficiency of the micro-LED 100A.

Furthermore, since the opening 131 of the current controlling layer 130 makes the emitting area of the micro-LED 100A smaller than the size of the micro-LED 100A, it is possible to continue miniaturization of the emitting area of the micro-LED 100A while remain the size of the micro-LED 100A to allow the micro-LED 100A to be manufactured with acceptable yield rate. For example, a 20 µm×20 µm micro-LED 100A with a 2 µm×2 µm opening can perform the same light output characteristics as an ideal 2 µm×2 µm micro-LED.

In some embodiments, the size of the micro-LED 100A is smaller than 100 µm×100 µm or 0.01 mm$^2$.

In general, the area of the opening 131 viewed in a direction normal to the current controlling layer 130 occupies 1%-95% of the total area of the active layer 123. If the area of the opening 131 occupies less than 1% of the total area of the active layer 123, the opening 131 may be too small, and therefore a complex photolithography process may be needed. If the area of the opening 131 occupies greater than 95% of the total area of the active layer 123, the function of decreasing the emitting area will not be achieved.

In some embodiments, the current spreading length of the first type semiconductor layer 122 is less than the current spreading length of the second type semiconductor layer 124. In some embodiments, the current spreading length of the second type semiconductor layer 124 is over 20 times greater than the current spreading length of the first type semiconductor layer 122. In this configuration, charge carriers in the first type semiconductor layer 122 are more difficult to spread to the side surface of the first type semiconductor layer 122 and/or the side surface of the active layer 123. Therefore, the emitting area (or region) can be well-controlled.

The current spreading length of lateral direction of a semiconductor layer of a diode is determined by the following equation I:

$$L_s = \sqrt{\frac{t n_{ideal} KT}{\rho J_0 |e|}}, \qquad \text{Equation I}$$

where $L_s$ is the current spreading length of the semiconductor layer of the diode, t is the thickness of the semiconductor layer, $n_{ideal}$ is the ideality factor of the diode, K is the Boltzmann constant, T is the temperature of the semiconductor layer in Kelvin, ρ is the resistivity of the semiconductor layer, $J_0$ is the current density at the interface between the semiconductor layer and a electrode of the diode, and e is the electric charge of an electron.

As confirmed by the aforementioned equation I, the current spreading length of the semiconductor layer of the diode is proportional to $$\sqrt{\frac{t}{\rho}}.$$

Therefore, in some embodiments, the first type semiconductor layer 122 has a resistivity $\rho_1$ and a thickness $t_1$, the second type semiconductor layer 124 has a resistivity $\rho_2$ and a thickness $t_2$, and $$\sqrt{\frac{t_1}{\rho_1}} < \sqrt{\frac{t_2}{\rho_2}}$$

to make the current spreading length of the first type semiconductor layer 122 to be less than the current spreading length of the second type semiconductor layer 124.

Figure 13:
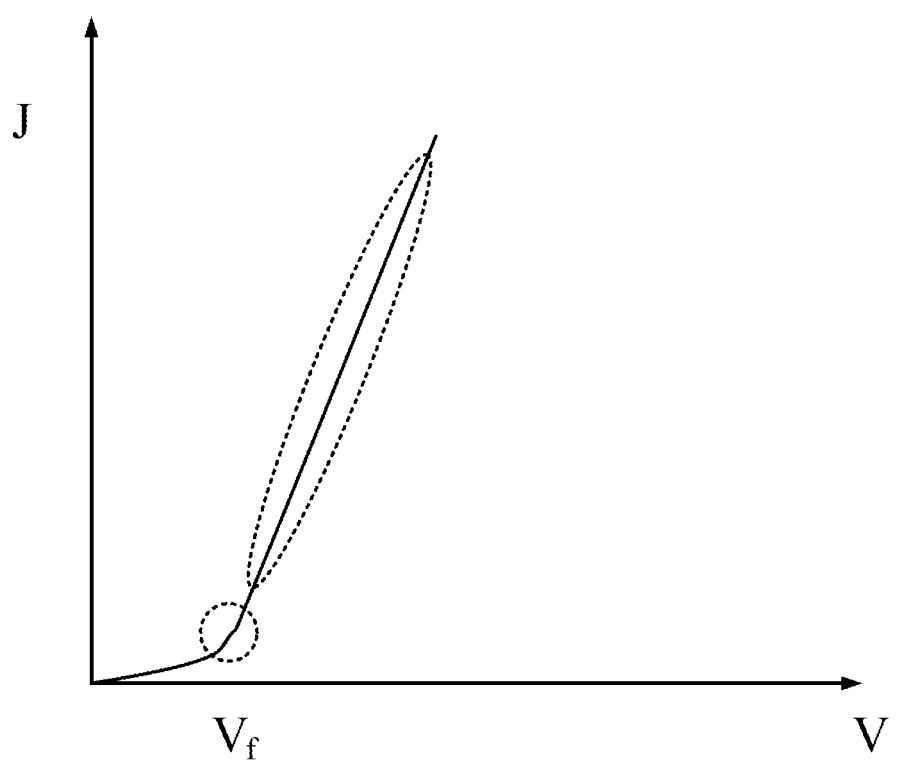
FIG. 13 illustrates a current density of the emitting area versus voltage JV curve of a micro-LED.

FIG. 13 illustrates a current density of the emitting area versus voltage JV curve of a micro-LED. In the mid/low power operation (i.e., at the region indicated by the dotted circle in FIG. 13), the operating of a conventional micro-LED is close to it's $V_f$ (threshold voltage), this makes reliability problems/or non-uniform characteristics among different micro-LEDs.

Therefore, in some embodiments, the current controlling layer 130 with the opening 131 is joined with the first type semiconductor layer 122, which has a short current spreading length. Since the first type semiconductor layer 122 has the short current spreading length, the first type semiconductor layer 122 for example has high resistivity and is thin in thickness, as illustrated in FIG. 3A. Furthermore, since the opening 131 of the current controlling layer 130 accompanied with the first type semiconductor layer 122 having the short current spreading length limits the area where the current goes into the micro-LED 100A, the emitting area of the micro-LED 100A can be decreased to be smaller than the area of the active layer 123 so as to provide an adequate brightness, and the current density within the emitting area of the micro-LED 100A increases. Since the current density of the micro-LED 100A increases, the micro-LED 100A can be operated in the linear power operation (i.e., at the region indicated by the dotted oval in FIG. 13). The result is the better reliability and a better uniform characteristic of the micro-LED 100A.

In some embodiments, the first type semiconductor layer 122 is made of, for example, p-doped GaN or p-doped AlGaInP. The thickness of the first type semiconductor layer 122 is in a range from 50 nm to 20 µm. The first type semiconductor layer 122 is formed by, for example, epitaxy.

In some embodiments, the first type semiconductor layer 122 may include an optional ohm contact layer (not shown) to reduce the contact resistance between the first conductive layer 140 and the first type semiconductor layer 122. In some embodiments, the ohm contact layer and the rest of the first type semiconductor layer 122 are made of, for example, p-doped GaN or p-doped AlGaInP, while the ohm contact layer is doped more heavily than the rest of the first type semiconductor layer 122. Alternatively, the ohm contact layer is made of, for example, InGaN, and the rest of the first type semiconductor layer 122 is made of, for example, p-doped GaN or p-doped AlGaInP. The thickness of the ohm contact layer is in a range from 5 nm to 2 µm. The thickness of the rest of the first type semiconductor layer 122 is in a range from 50 nm to 20 µm.

In some embodiments, the second type semiconductor layer 124 is made of, for example, n-doped GaN:Si. The thickness of the second type semiconductor layer 124 is in a range from 0.1 µm to 50 µm. The second type semiconductor layer 124 is formed by, for example, epitaxy.

Similarly, in some embodiments, the second type semiconductor layer 124 also includes an optional ohm contact layer (not shown) to reduce the contact resistance between the second conductive layer 150 and the second type semiconductor layer 124. In some embodiments, the ohm contact layer and the rest of the second type semiconductor layer 124 are made of, for example, n-doped GaN:Si, while the ohm contact layer is doped more heavily than the rest of the second type semiconductor layer 124. The thickness of the ohm contact layer is in a range from 5 nm to 2 µm. The thickness of the rest of the second type semiconductor layer 124 is in a range from 0.1 µm to 50 µm.

In some embodiments, the active layer 123 is made of, for example, heterostructure or quantum well structure. The thickness of the active layer 123 is in a range from 50 nm to 5 µm. The active layer 123 is formed by, for example, epitaxy.

In some embodiments, the active layer 123 can be omitted. In the case that the active layer 123 is omitted, the second type semiconductor layer 124 is directly joined with the first type semiconductor layer 122.

The second conductive layer 150 of the micro-LED 100A shown in FIG. 3A is at least partially joined with the second type semiconductor layer 124, such that the first type semiconductor layer 122, the active layer 123, and the second type semiconductor layer 124 are disposed between the first conductive layer 140 and the second conductive layer 150. Both the first conductive layer 140 and the second conductive layer 150 are made of a conductive material, such as metal or a transparent conductive material, e.g., indium tin oxide (ITO). The first conductive layer 140 and the second conductive layer 150 can be formed by, for example, physical vapor deposition (PVD) or chemical vapor deposition (CVD).

In addition, the second conductive layer 150 in the embodiment fully contacts the second type semiconductor layer 124, but the invention is not limited in this regard. In some embodiments, the second conductive layer 150 is in the form of a bonding wire and partially contacts the second type semiconductor layer 124.

In some embodiments, a combination of the first type semiconductor layer 122, the active layer 123, the second type semiconductor layer 124, and the current controlling layer 130 with the opening 131 is a solid with at least two planes. For example, the combination of the first type semiconductor layer 122, the active layer 123, the second type semiconductor layer 124, and the current controlling layer 130 with the opening 131 is a cylinder, a polyhedron, or a trapezoidal solid.

In some embodiments, the current controlling layer 130 is transparent. In some embodiments, the current controlling layer 130 is monochrome transparent. In some embodiments, the current controlling layer 130 is reflective. In some embodiments, the current controlling layer 130 is monochrome reflective.

In some embodiments, the current controlling layer 130 is a dielectric layer which is made of a dielectric material, such as silicon nitride or silicon dioxide. The thickness of the current controlling layer 130 is in a range from 1 nm to 5 µm.

The current controlling layer 130 is formed by, for example, physical vapor deposition (PVD), CVD. However, the current controlling layer 130 of the invention is not limited to be a dielectric layer.

Figure 3B:
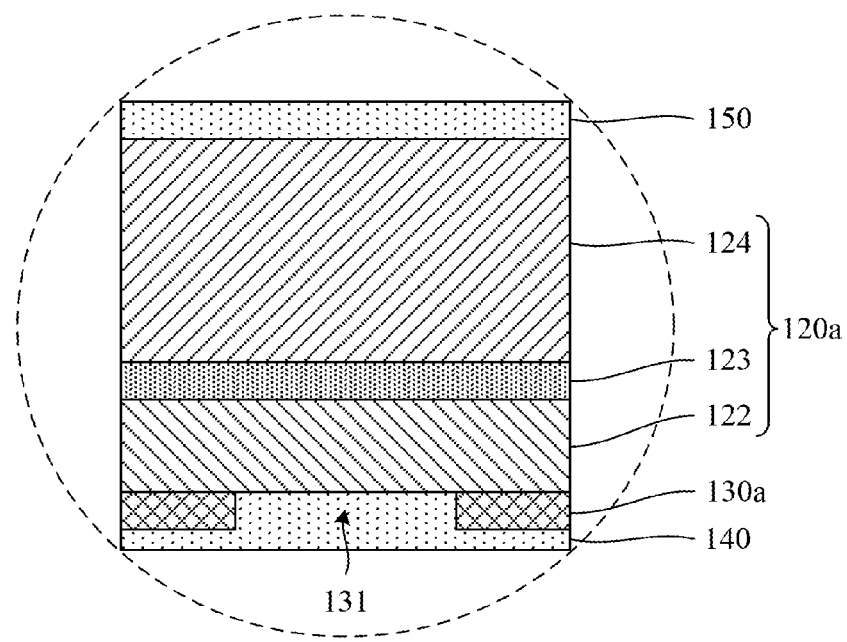
FIG. 3B is an enlarged cross-sectional view of the micro-LED in FIG. 1 according to a second embodiment of this invention.

FIG. 3B is an enlarged cross-sectional view of the micro-LED 100A according to a second embodiment of this invention. Referring now to FIG. 3B, the first type semiconductor layer 122 and the second type semiconductor layer 124 form a first p-n junction, the current controlling layer 130a and the first type semiconductor layer 122 form a second p-n junction, and the first conductive layer 140 and the second conductive layer 150 are configured to forward bias the first p-n junction while reverse bias the second p-n junction. In an embodiment, the first type semiconductor layer 122 is a p type semiconductor layer, and the second type semiconductor layer 124 and the current controlling layer 130a are n type semiconductor layers. In another embodiment, the first type semiconductor layer 122 is an n type semiconductor layer, and the second type semiconductor layer 124 and the current controlling layer 130a are p type semiconductor layers. As a result, no current will flow through the part of the active layer 123 corresponding to the current controlling layer 130a, so that the part of the active layer 123 is prevented from emitting light.

Other details regarding the micro-LED 100A of FIG. 3B are similar to the micro-LED 100A of FIG. 3A and therefore are not repeated here to avoid duplicity.

Figure 3C:
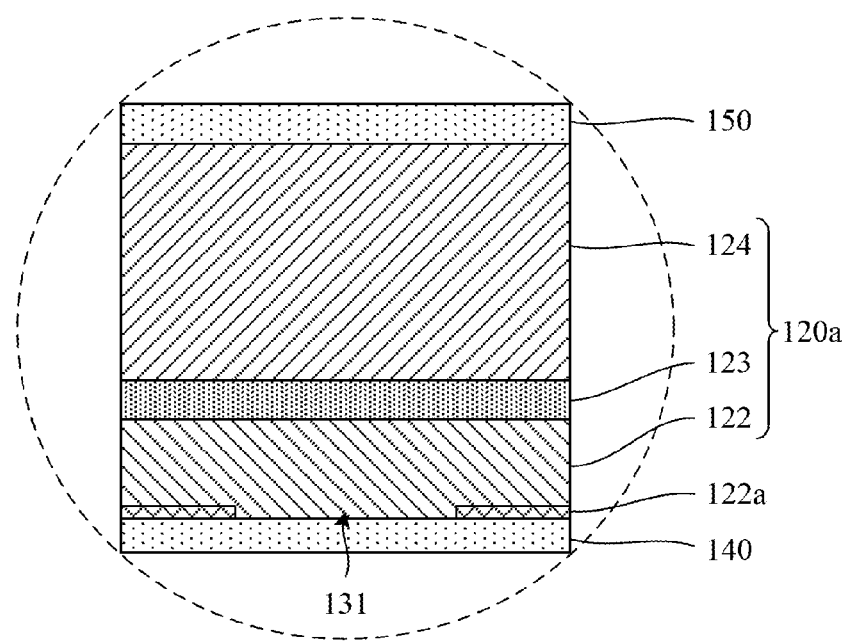
FIG. 3C is an enlarged cross-sectional view of the micro-LED in FIG. 1 according to a third embodiment of this invention.

FIG. 3C is an enlarged cross-sectional view of the micro-LED 100A according to still a third embodiment of this invention. Referring now to FIG. 3C, the first type semiconductor layer 122 and the second type semiconductor layer 124 form a p-n junction, and the current controlling layer 122a and the first type semiconductor layer 122 form a Schottky barrier. In the embodiments, the first type semiconductor layer 122 may consisted of heavily Mg-doped p-GaN (e.g., 30 nm in thickness and $[Mg]=\sim 2.2\times 10^{20}$ cm-3) or moderately Mg-doped p-GaN (e.g., 120 nm in thickness and $[Mg]=\sim 2.1\times 10^{19}$ cm-3), for example. To fabricate the current controlling layer 122a, an $Ar^+$ plasma treatment on the first type semiconductor layer 122 was performed using a predetermined working pressure, rf power, and a predetermined process time. The Schottky barrier were first fabricated on the treated surfaces of the first type semiconductor layer 122 using an Ni/Ag/Pt ohmic contact as the first conductive layer 140. It is evident that the bias current of the Ni/Ag/Pt contact formed on the plasma-treated surfaces of the first type semiconductor layer 122 are nearly zero in the measured voltage range from −1 to 5V, while the plasma-untreated surfaces of the first type semiconductor layer 122 shows ohmic behavior. That is, the $Ar^+$ plasma treatment to the first type semiconductor layer 122 led to the formation of a large barrier height. As a result, no current will flow through the part of the active layer 123 corresponding to the current controlling layer 122a, so that the part of the active layer 123 is prevented from emitting light.

Other details regarding the micro-LED 100A of FIG. 3C are similar to the micro-LED 100A of FIG. 3A and therefore are not repeated here to avoid duplicity.

In some embodiments, the first type semiconductor layer 122 has the resistivity $\rho_1$ mentioned above, the current controlling layer 130 is a high resistivity layer which has a resistivity $\rho_h$, and $\rho_h > \rho_1$. For example, $\rho_h$ may be over 10 times greater than $\rho_1$, but the invention is not limited in this regard. In some embodiments, the current controlling layer 130 can be a semiconductor layer lighter doped or un-doped respect to the first type semiconductor layer 122, a semi-metal layer, a ceramic layer, or a semi-insulator layer. As a result, the current controlling layer 130 can control most of the current to flow through the opening 131 of the current controlling layer 130, so as to limit the emitting area of the active layer 123 at a part corresponding to the opening 131 as possible. For example, under the circumstances that the resistivity $\rho_h$ of the current controlling layer 130 is 10 times greater than the resistivity $\rho_1$ of the first type semiconductor layer 122, at least 50% current will flow through the opening 131 having relatively small area, so as to achieve the purpose of current control. Thus, the current density of the opening area is higher comparing to the other region.

In some embodiments, as shown in FIG. 3B, the first type semiconductor layer 122 is a p type semiconductor layer, the second type semiconductor layer 124 is an n type semiconductor layer, and the current controlling layer 130 is a hole blocking layer. The LUMO (Lowest Unoccupied Molecular Orbital) energy level of the current controlling layer 130 is lower than that of the first type semiconductor layer 122 for at least 0.2 eV, so as to block holes transporting from the first type semiconductor layer 122 to the active layer 123. As a result, the holes in the first type semiconductor layer 122 can only transport to the active layer 123 via the opening 131 of the current controlling layer 130. For example, the material of the current controlling layer 130 can be $Al_xGa_yN_{(1-x-y)}$ with superlattice structure.

In some embodiments, as shown in FIG. 3B, the first type semiconductor layer 122 is an n type semiconductor layer, the second type semiconductor layer 124 is a p type semiconductor layer, and the current controlling layer 130 is an electron blocking layer. The HOMO (Highest Occupied Molecular Orbital/Conduction band) energy level of the current controlling layer 130 is higher than that of the first type semiconductor layer 122 for at least 0.2 eV, so as to block electrons transporting from the first type semiconductor layer 122 to the active layer 123. As a result, the electrons in the first type semiconductor layer 122 can only transport to the active layer 123 via the opening 131 of the current controlling layer 130. For example, the material of the current controlling layer 130 can be $Al_xGa_yN_{(1-x-y)}$ with superlattice structure.

Referring back to FIG. 1 and FIG. 3A, in the embodiment, the current controlling layer 130 is located at a side of the micro p-n diodes 120a proximal to the bonding electrode 310 of the receiving substrate 300. That is, the opening 131 of the current controlling layer 130 faces toward the receiving substrate 300. However, the invention is not limited in this regard.

Figure 4A:
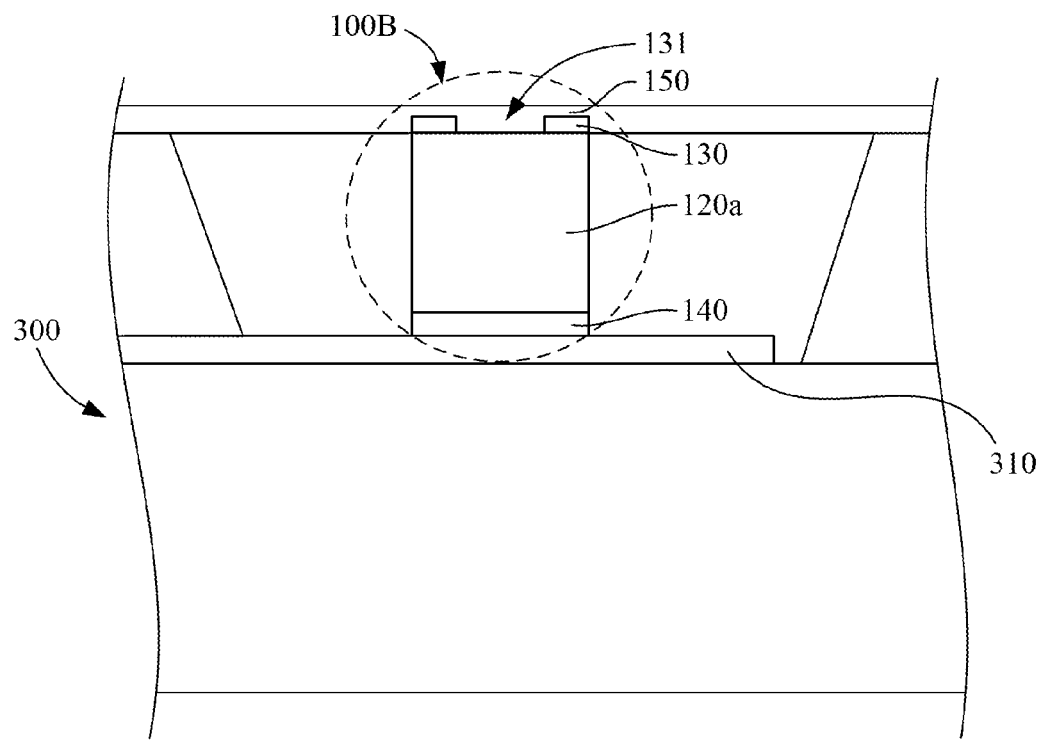
FIG. 4A is a cross-sectional view of a micro-LED disposed on a receiving substrate according to an embodiment of this invention.
Figure 4B:
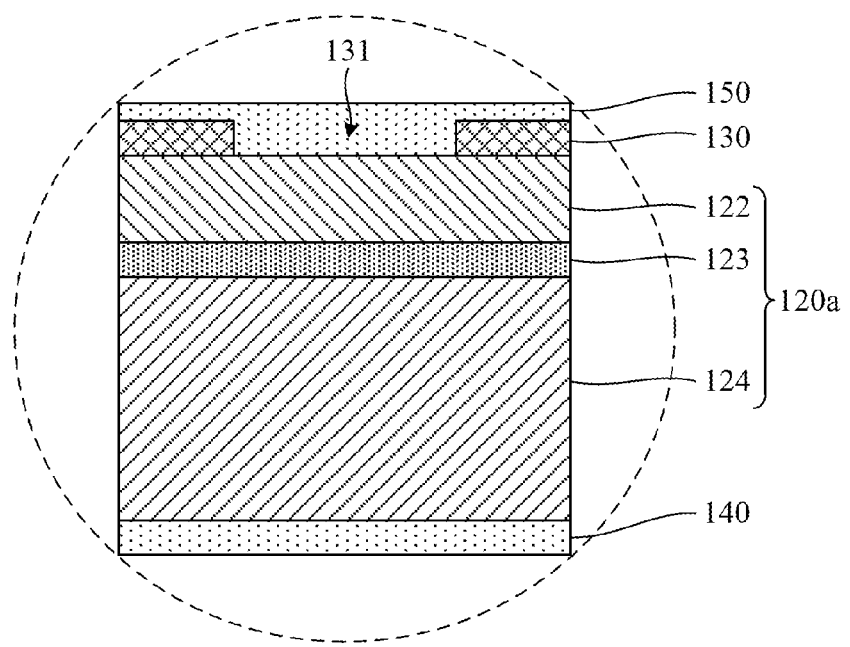
FIG. 4B is an enlarged cross-sectional view of the micro-LED in FIG. 4A according to an embodiment of this invention.

FIG. 4A is a cross-sectional view of a micro-LED 100B disposed on a receiving substrate 300 according to an embodiment of this invention. FIG. 4B is an enlarged cross-sectional view of the micro-LED 100B in FIG. 4A according to an embodiment of this invention. The micro-LED 100B also includes a micro p-n diodes 120a, a current controlling layer 130, a first conductive layer 140, and a second conductive layer 150. A combination of the first type semiconductor layer 122, the active layer 123, the second type semiconductor layer 124, the current controlling layer 130, the first conductive layer 140, and the second conductive layer 150 is joined with the bonding electrode 310 on the receiving substrate 300, so as to form a micro-LED display. The difference between the micro-LED 100B of FIG. 4A and the micro-LED 100A of FIG. 3A is that the current controlling layer 130 of FIG. 4A is located at a side of the micro p-n diodes 120a distal to the bonding electrode 310 of the receiving substrate 300. That is, the opening 131 of the current controlling layer 130 of FIG. 4A faces away from the receiving substrate 300.

To manufacture the micro-LED 100B shown in FIGS. 4A & 4B, a semiconductor device layer 120 and a patterned current controlling layer 130 can be sequentially formed on a growth substrate 110 (as illustrated in FIG. 2C). A difference between the manufacturing of the micro-LED 100B of FIG. 4A and the micro-LED 100A of FIG. 1 is that the formation of the first conductive layer 140 of micro-LED 100B is performed after bonding the structure of FIG. 2C to the structure of FIG. 2E (as the operation illustrated in FIG. 2F) and removing the growth substrate 110. After forming the first conductive layer 140 on the thinned p-n diode layer 120, the combination of the first conductive layer 140, the thinned p-n diode layer 120, and the current controlling layer 130 is etched to form a plurality of micro p-n diodes 120a (as the operation illustrated in FIG. 2H). Alternatively, in some embodiments, the first conductive layer 140 is formed on the receiving substrate 300 in advance, rather than formed on the thinned p-n diode layer 120. In some embodiments, the first conductive layer 140 can be omitted, and the p-n diode layer 120 can be directly joined with the bonding electrode 310 on the receiving substrate 300.

Afterwards, to make the opening 131 of the current controlling layer 130 of FIG. 4A face away from the receiving substrate 300, the micro p-n diodes 120a can be transferred to another carrier substrate 200 to reverse the orientation of the micro p-n diodes 120a prior to transferring the micro p-n diodes 120a to the receiving substrate 300 (as the operation illustrated in FIG. 2I). After bonding the micro p-n diodes 120a to the later carrier substrate 200, the adhesion force of the adhesive layer 210 on the former carrier substrate 200 is decreased, so as to separate the micro p-n diodes 120a from the former carrier substrate 200. Alternatively, in some embodiments, the micro p-n diodes 120a can be picked up twice sequentially by two transfer heads to reverse the orientation of the micro p-n diodes 120a prior to transferring the micro p-n diodes 120a to the receiving substrate 300. Other details regarding the micro-LED 100B of FIG. 4A are similar to the micro-LED 100A of FIG. 1 and therefore are not repeated here to avoid duplicity.

Figure 4C:
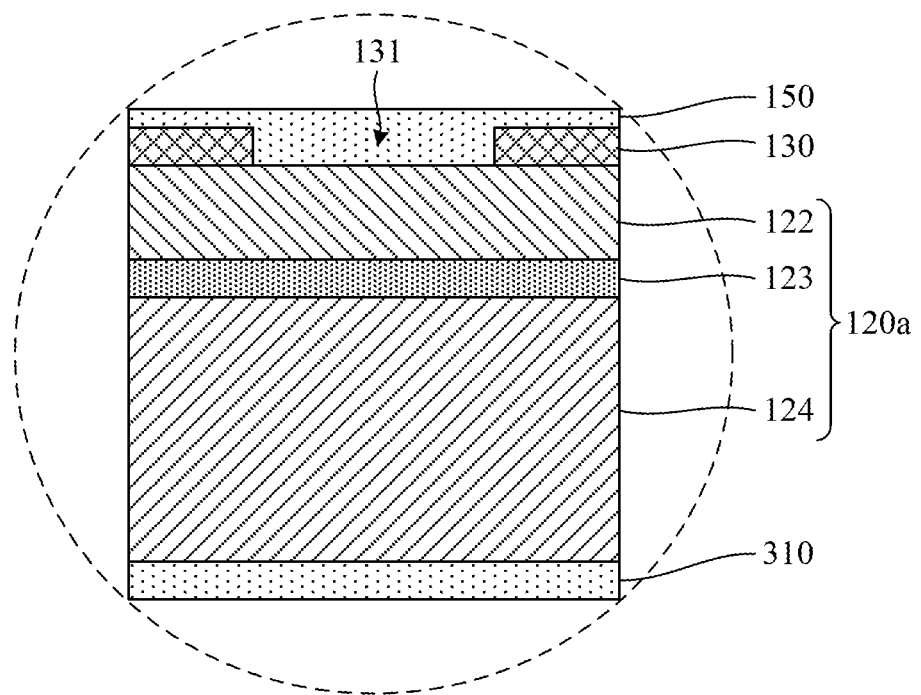
FIG. 4C is an enlarged cross-sectional view of the micro-LED in FIG. 4A according to an embodiment of this invention.

FIG. 4C is an enlarged cross-sectional view of the micro-LED 100B in FIG. 4A according to an embodiment of this invention. A difference between the manufacturing of the micro-LED 100B of FIG. 4C and the micro-LED 100B of FIG. 4A is that the operation of forming the first conductive layer 140 can be omitted in the micro-LED 100B of FIG. 4A, and the combination of first type semiconductor layer 122, the active layer 123, the second type semiconductor layer 124, and the current controlling layer 130 can be directly bonded to the bonding electrode 310 of the receiving substrate 300. In other words, the bonding electrode 310 can serve as the first conductive layer 140 of the micro-LED 100B of FIG. 4A.

Other details regarding the micro-LED 100B of FIG. 4C are similar to the micro-LED 100B of FIG. 4A and therefore are not repeated here to avoid duplicity.

Figure 5A:
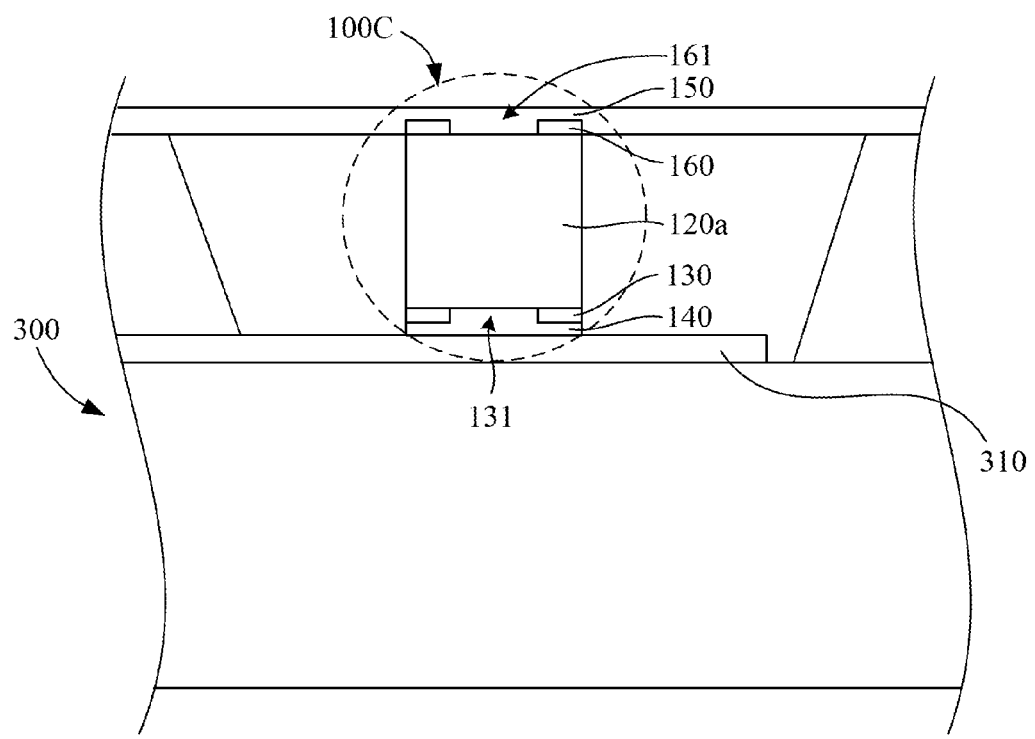
FIG. 5A is a cross-sectional view of a micro-LED disposed on a receiving substrate according to an embodiment of this invention.
Figure 5B:
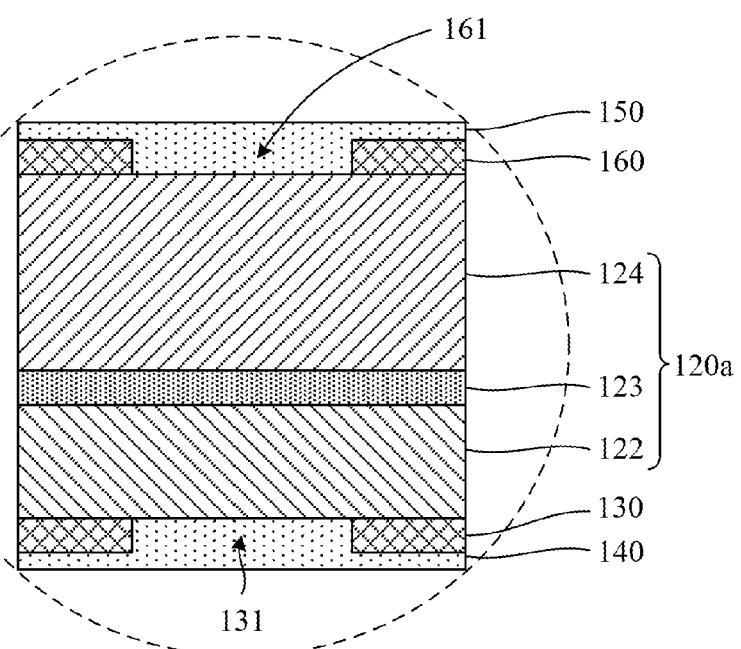
FIG. 5B is an enlarged cross-sectional view of the micro-LED in FIG. 5A according to an embodiment of this invention.

FIG. 5A is a cross-sectional view of a micro-LED 100C disposed on a receiving substrate 300 according to an embodiment of this invention. FIG. 5B is an enlarged cross-sectional view of the micro-LED 100C in FIG. 5A according to an embodiment of this invention. The micro-LED 100C also includes a micro p-n diodes 120a, a current controlling layer 130, a first conductive layer 140, and a second conductive layer 150, and further includes another current controlling layer 160. The difference between the micro-LED 100C of FIG. 5A and the micro-LED 100A of FIG. 1 is that the micro-LED 100C further includes the current controlling layer 160 located at a side of the micro p-n diodes 120a distal to the bonding electrode 310 of the receiving substrate 300, in which the current controlling layer 160 has at least one opening 161 therein, and the second conductive layer 150 extends through the opening 161 of the current controlling layer 160 to be electrically coupled with the second type semiconductor layer 124. That is, the opening 161 of the current controlling layer 160 of FIG. 5A faces away from the receiving substrate 300.

To manufacture the micro-LED 100C shown in FIGS. 5A & 5B, operations illustrated by FIG. 2A-2G can be sequentially performed. A difference between the manufacturing of the micro-LED 100C of FIG. 5A and the micro-LED 100A of FIG. 1 is that the formation of the current controlling layer 160 is performed after removing the growth substrate 110. After forming the current controlling layer 160 on the thinned p-n diode layer 120, the combination of the current controlling layer 160, the thinned p-n diode layer 120, the current controlling layer 130, and the first conductive layer 140 is etched to form a plurality of micro p-n diodes 120a (as the operation illustrated in FIG. 2H). Afterwards, the micro p-n diodes 120a are poised for pick up and transfer to the receiving substrate 300 (as the operation illustrated in FIG. 2I). Other details regarding the micro-LED 100C of FIG. 5A are similar to the micro-LED 100A of FIG. 1 and therefore are not repeated here to avoid duplicity.

Figure 6:
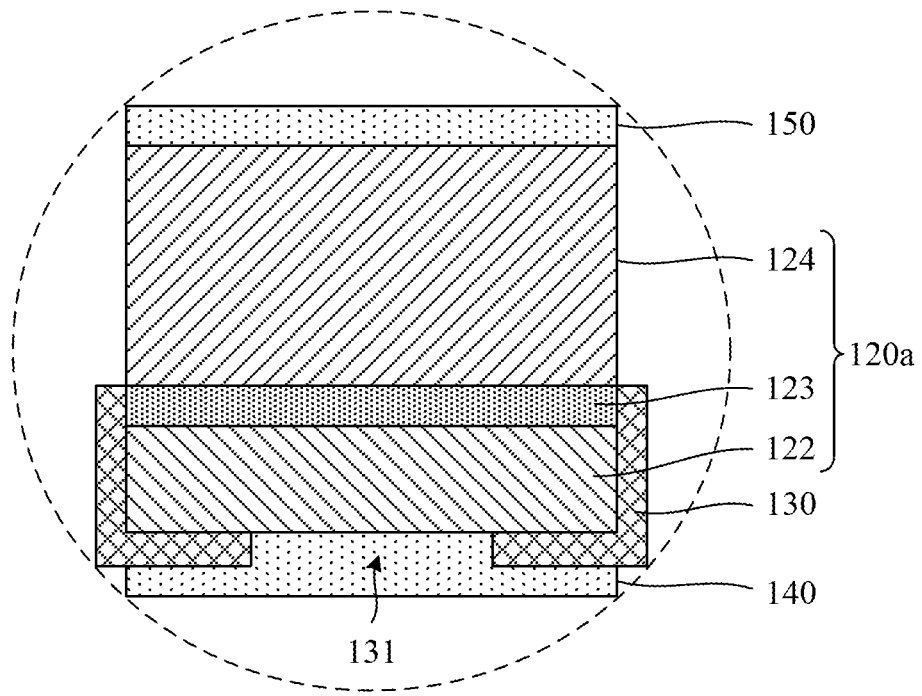
FIG. 6 is an enlarged cross-sectional view of a micro-LED according to another embodiment of this invention.

FIG. 6 is an enlarged cross-sectional view of a micro-LED 100A according to another embodiment of this invention. Similar to the current controlling layer 130 in FIG. 3A, the current controlling layer 130 of FIG. 6 partially cover a major surface of the first type semiconductor layer 122 distal to the second type semiconductor layer 124. The difference between the current controlling layer 130 of FIG. 6 and the current controlling layer 130 of FIG. 3A is that the current controlling layer 130 of FIG. 6 further at least partially covers the side surfaces of the first type semiconductor layer 122 and the active layer 123, and the current controlling layer 130 must be a dielectric layer. In this configuration, the side surfaces of the first type semiconductor layer 122 and the active layer 123 can be protected from moisture, process contamination, and mechanical damage by the current controlling layer 130. It is noted that all embodiments of the current controlling layer described above (i.e., the current controlling layers 130, 130a, and 122a) can be applied if the current controlling layer only partially covers the side surface of the first type semiconductor layer 122 without the side surface of the active layer 123.

Other details regarding the micro-LED 100A of FIG. 6 are similar to the micro-LED 100A of FIG. 3A and therefore are not repeated here to avoid duplicity.

Figure 7A:
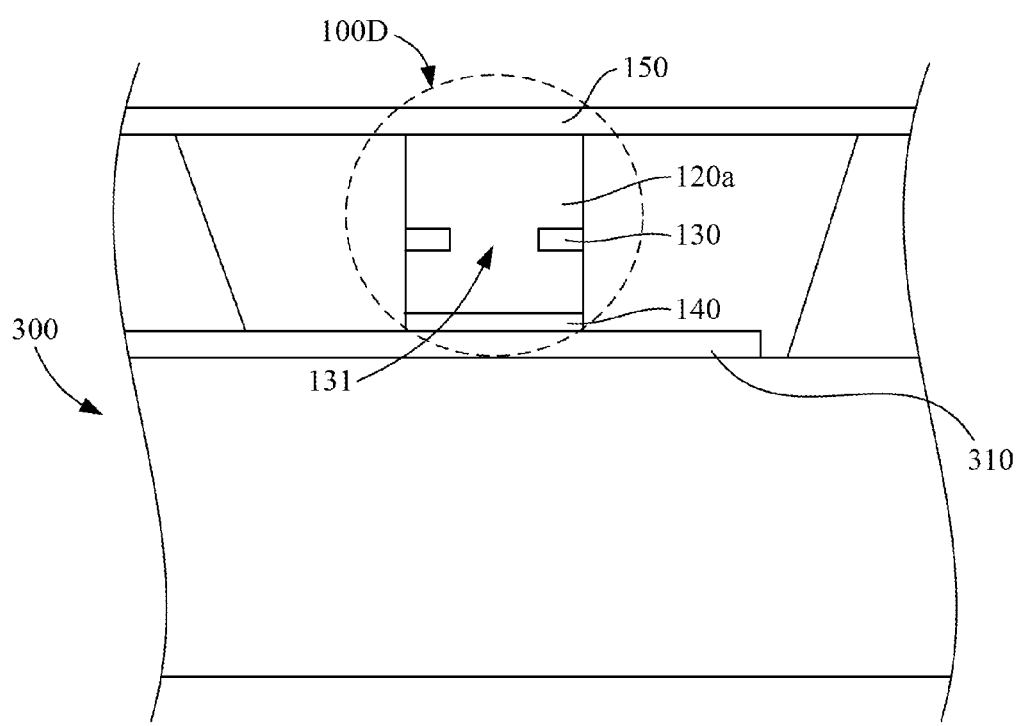
FIG. 7A is a cross-sectional view of a micro-LED disposed on a receiving substrate according to an embodiment of this invention.
Figure 7B:
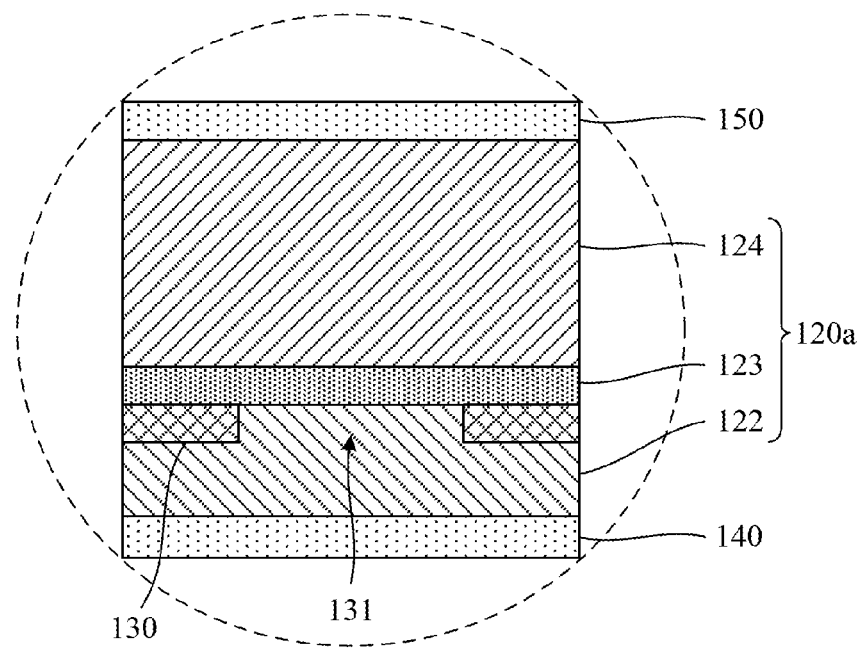
FIG. 7B is an enlarged cross-sectional view of the micro-LED in FIG. 7A according to an embodiment of this invention.

FIG. 7A is a cross-sectional view of a micro-LED 100D disposed on a receiving substrate 300 according to an embodiment of this invention. FIG. 7B is an enlarged cross-sectional view of the micro-LED 100D in FIG. 7A according to an embodiment of this invention. The micro-LED 100D includes a micro p-n diode 120a, a current controlling layer 130 disposed in the micro p-n diode 120a, a first conductive layer 140, and a second conductive layer 150. The micro p-n diode 120a includes a first type semiconductor layer 122, an active layer 123, and a second type semiconductor layer 124. The first type semiconductor layer 122 is a p type semiconductor layer, and the second type semiconductor layer 124 is an n type semiconductor layer. The second type semiconductor layer 124 is joined with the first type semiconductor layer 122. The active layer 123 is disposed between the first type semiconductor layer 122 and the second type semiconductor layer 124. The current controlling layer 130 is disposed between the first type semiconductor layer 122 and the active layer 123 and has at least one opening 131, and the first type semiconductor layer 122 is electrically coupled with the active layer 123 through the opening 131 of the current controlling layer 130. The first conductive layer 140 is electrically coupled with the first type semiconductor layer 122. The second conductive layer 150 is electrically coupled with the second type semiconductor layer 124. In some embodiments, the first conductive layer 140 can be omitted, and the micro p-n diode 120a can be directly joined with the bonding electrode 310 on the receiving substrate 300.

It is noted that the difference between the current controlling layer 130 of FIG. 7B and the current controlling layer 130 of FIG. 1 is that the current controlling layer 130 of FIG. 7B is disposed between the first type semiconductor layer 122 and the active layer 123, and the current controlling layer 130 contacts the active layer 123. To manufacture the micro-LED 100D shown in FIG. 7B in which the current controlling layer 130 is disposed between the first type semiconductor layer 122 and the active layer 123, the formation of the current controlling layer 130 illustrated in FIGS. 2A & 2C can be brought forward to be performed after the formation of the active layer 123 and before the formation of the first type semiconductor layer 122 illustrated in FIG. 2B.

Figure 7C:
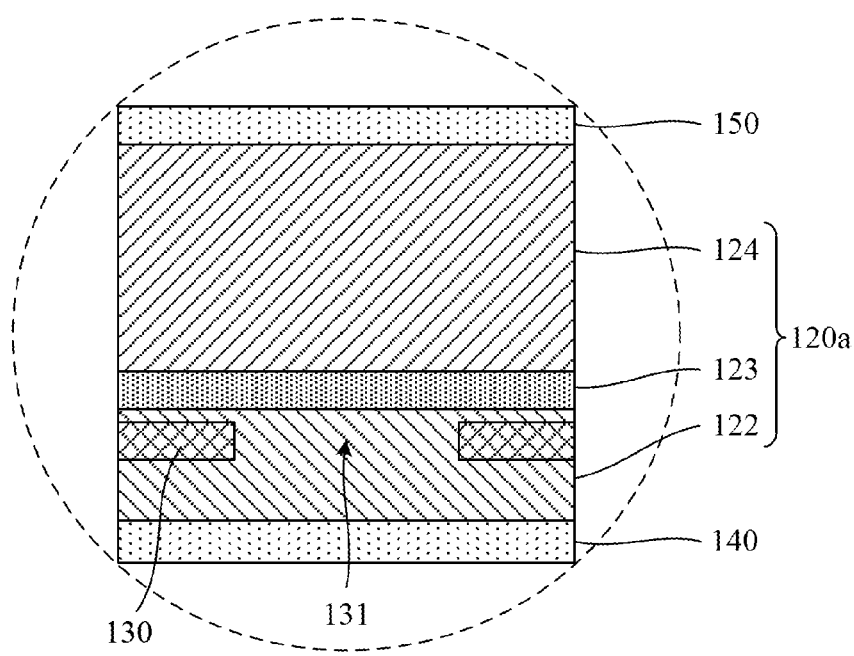
FIG. 7C is an enlarged cross-sectional view of the micro-LED in FIG. 7A according to another embodiment of this invention.

FIG. 7C is an enlarged cross-sectional view of the micro-LED 100D in FIG. 7A according to another embodiment of this invention. The difference between the current controlling layer 130 of FIG. 7C and the current controlling layer 130 of FIG. 7B is that the current controlling layer 130 of FIG. 7C is disposed in the first type semiconductor layer 122 without contacting the active layer 123. In this configuration, the first type semiconductor layer 122 may protect the active layer 123 while manufacturing the current controlling layer 130.

To manufacture the micro-LED 100D shown in FIG. 7C in which the current controlling layer 130 is disposed in the first type semiconductor layer 122, the formation of the current controlling layer 130 illustrated in FIGS. 2A & 2C can be brought forward to be performed during the formation of the first type semiconductor layer 122 illustrated in FIG. 2B. For example, the current controlling layer 130 can be formed after forming 10% of the first type semiconductor layer 122, and the rest 90% of the first type semiconductor layer 122 is then formed after the formation of the current controlling layer 130.

Other details regarding the micro-LED 100D of FIG. 7C are similar to the micro-LED 100D of FIG. 7B and therefore are not repeated here to avoid duplicity.

Figure 7D:
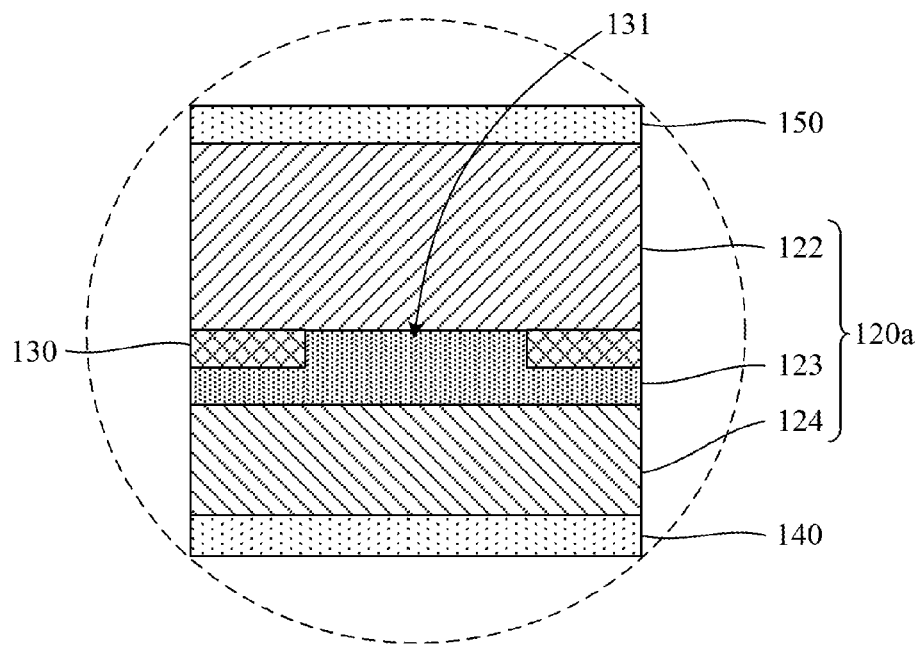
FIG. 7D is an enlarged cross-sectional view of the micro-LED in FIG. 7A according to another embodiment of this invention.

FIG. 7D is an enlarged cross-sectional view of the micro-LED 100D in FIG. 7A according to an embodiment of this invention. The differences between the current controlling layer 130 of FIG. 7D and the current controlling layer 130 of FIG. 1 are that the current controlling layer 130 of FIG. 7D is disposed between the first type semiconductor layer 122 and the active layer 123, the current controlling layer 130 contacts the active layer 123, the first type semiconductor layer 122 is an n type semiconductor layer, and the second type semiconductor layer 124 is a p type semiconductor layer. To manufacture the micro-LED 100D shown in FIG. 7D in which the current controlling layer 130 is disposed between the first type semiconductor layer 122 and the active layer 123, the formation of the current controlling layer 130 illustrated in FIGS. 2A & 2C can be brought forward to be performed before the formation of the active layer 123 illustrated in FIG. 2B.

In the embodiment, after the patterned current controlling layer 130 is formed on the first type semiconductor layer 122, the active layer 123 is formed from the opening 131 of the current controlling layer 130, but the invention is not limited in this regard. In some embodiments, after the patterned current controlling layer 130 is formed on the first type semiconductor layer 122, the opening 131 of the current controlling layer 130 can be further filled with first type semiconductor layer 122.

Other details regarding the micro-LED 100D of FIG. 7D are similar to the micro-LED 100D of FIG. 7B and therefore are not repeated here to avoid duplicity.

Figure 7E:
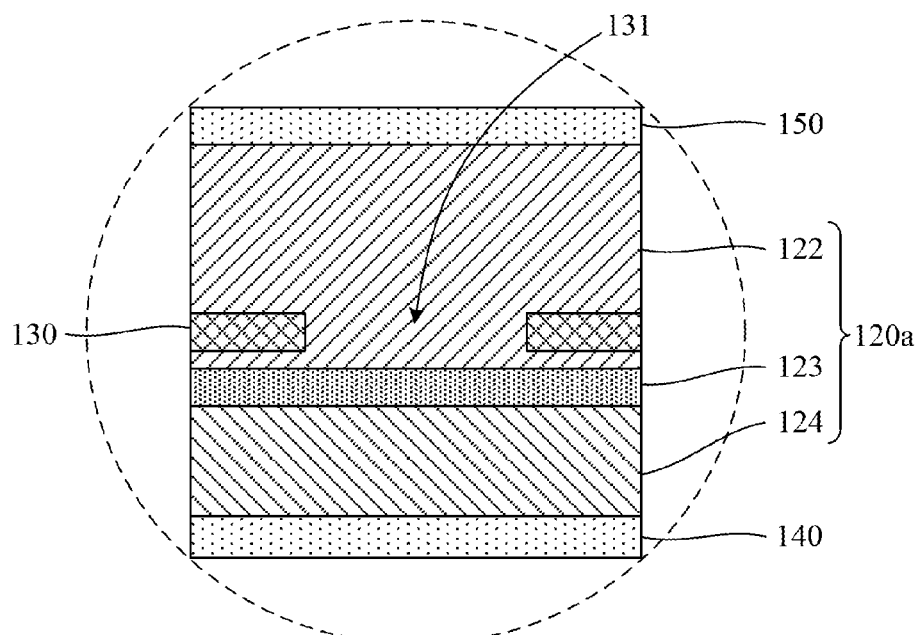
FIG. 7E is an enlarged cross-sectional view of the micro-LED in FIG. 7A according to another embodiment of this invention.

FIG. 7E is an enlarged cross-sectional view of the micro-LED 100D in FIG. 7A according to another embodiment of this invention. The difference between the current controlling layer 130 of FIG. 7E and the current controlling layer 130 of FIG. 7D is that the current controlling layer 130 of FIG. 7E is disposed in the first type semiconductor layer 122 without contacting the active layer 123.

To manufacture the micro-LED 100D shown in FIG. 7E in which the current controlling layer 130 is disposed in the first type semiconductor layer 122, the formation of the current controlling layer 130 illustrated in FIGS. 2A & 2C can be brought forward to be performed during the formation of the first type semiconductor layer 122 illustrated in FIG. 2B. For example, the current controlling layer 130 can be formed after forming 90% of the first type semiconductor layer 122, and the rest 10% of the first type semiconductor layer 122 is then formed after the formation of the current controlling layer 130.

Other details regarding the micro-LED 100D of FIG. 7E are similar to the micro-LED 100D of FIG. 7D and therefore are not repeated here to avoid duplicity.

Figure 7F:
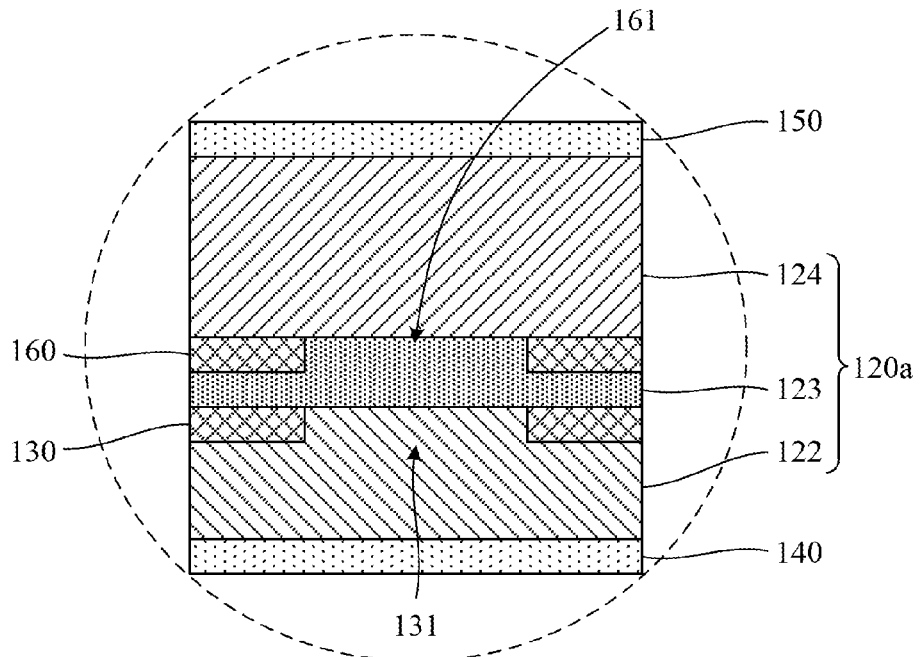
FIG. 7F is an enlarged cross-sectional view of the micro-LED in FIG. 7A according to another embodiment of this invention.

FIG. 7F is an enlarged cross-sectional view of the micro-LED 100D in FIG. 7A according to an embodiment of this invention. The difference between the micro-LED 100D of FIG. 7F and the micro-LED 100D of FIG. 7B is that the micro-LED 100D of FIG. 7F further includes a current controlling layer 160. The current controlling layer 160 is disposed between the active layer 123 and the second type semiconductor layer 124. That is, the current controlling layers 130 and 160 are respectively located at opposite sides of the active layer 123. To manufacture the micro-LED 100D shown in FIG. 7F in which the current controlling layer 130 is disposed between the first type semiconductor layer 122 and the active layer 123 and current controlling layer 160 is disposed between the second type semiconductor layer 124 and the active layer 123, the formation of the current controlling layer 160 can be performed after the formation of the second type semiconductor layer 124 and before the formation of the active layer 123 illustrated in FIG. 2B, and the formation of the current controlling layer 130 illustrated in FIGS. 2A & 2C can be brought forward to be performed after the formation of the active layer 123 and before the formation of the first type semiconductor layer 122 illustrated in FIG. 2B. Similarly, in some embodiments, the opening 161 of the current controlling layer 160 can be filled with the active layer 123 or the second type semiconductor layer 124.

Other details regarding the micro-LED 100D of FIG. 7F are similar to the micro-LED 100D of FIG. 7B and therefore are not repeated here to avoid duplicity.

Figure 7G:
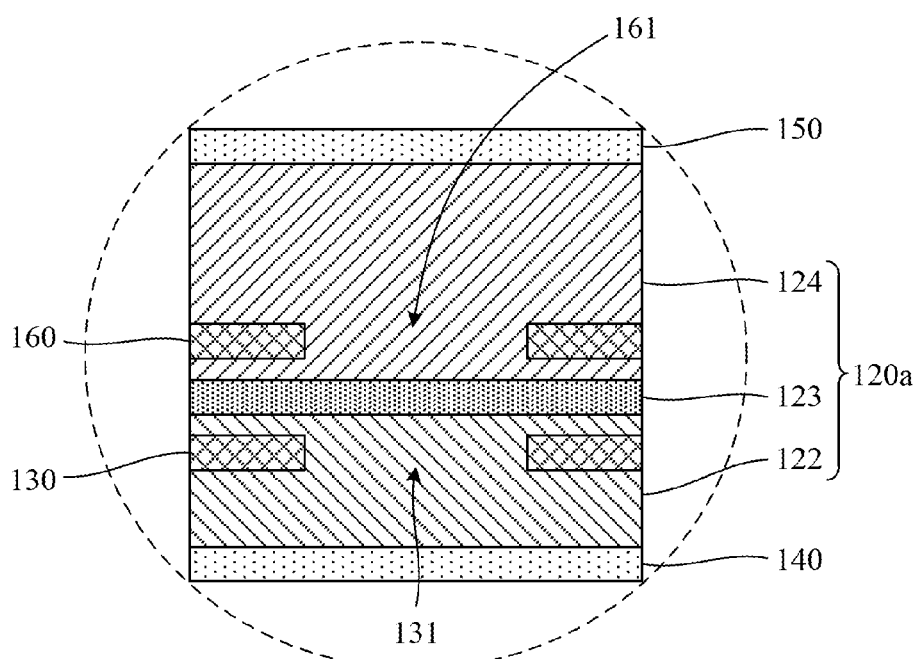
FIG. 7G is an enlarged cross-sectional view of the micro-LED in FIG. 7A according to another embodiment of this invention.

FIG. 7G is an enlarged cross-sectional view of the micro-LED 100D in FIG. 7A according to another embodiment of this invention. The differences between the current controlling layers 130 and 160 of FIG. 7G and the current controlling layers 130 and 160 of FIG. 7F are that the current controlling layer 130 of FIG. 7G is disposed in the first type semiconductor layer 122 without contacting the active layer 123 and the current controlling layer 160 of FIG. 7G is disposed in the second type semiconductor layer 124 without contacting the active layer 123. In this configuration, the first type semiconductor layer 122 may protect the active layer 123 while manufacturing the current controlling layer 130.

In some embodiments, only one of the current controlling layers 130 and 160 is formed to contact the active layer 123, and the other one of the current controlling layers 130 and 160 is formed without contacting the active layer 123.

To manufacture the micro-LED 100D shown in FIG. 7G in which the current controlling layer 130 is disposed in the first type semiconductor layer 122 and the current controlling layer 160 is disposed in the second type semiconductor layer 124, the formation of the current controlling layer 160 can be performed during the formation of the second type semiconductor layer 124 illustrated in FIG. 2B, and the formation of the current controlling layer 130 illustrated in FIGS. 2A & 2C can be brought forward to be performed during the formation of the first type semiconductor layer 122 illustrated in FIG. 2B. For example, the current controlling layer 160 can be formed after forming 90% of the second type semiconductor layer 124, and the rest 10% of the second type semiconductor layer 124 is then formed after the formation of the current controlling layer 160. For example, the current controlling layer 130 can be formed after forming 10% of the first type semiconductor layer 122, and the rest 90% of the first type semiconductor layer 122 is then formed after the formation of the current controlling layer 130.

Other details regarding the micro-LED 100D of FIG. 7G are similar to the micro-LED 100D of FIG. 7F and therefore are not repeated here to avoid duplicity.

In some embodiments, the current controlling layer 130 is disposed in the micro p-n diode 120a (e.g., between at least a part of the first type semiconductor layer 122 and the active layer 123 as shown in FIG. 7F and FIG. 7G), and the current controlling layer 160 is disposed outside the micro p-n diode 120a (e.g., between the second type semiconductor layer 124 and the second conductive layer 150 as shown in FIG. 5B). In some embodiments, the current controlling layer 130 is disposed outside the micro p-n diode 120a (e.g., between the first type semiconductor layer 122 and the first conductive layer 140 as shown in FIG. 5B), and the current controlling layer 160 is disposed in the micro p-n diode 120a (e.g., between at least a part of the second type semiconductor layer 124 and the active layer 123 as shown in FIG. 7F and FIG. 7G).

It is noted that in the micro-LEDs 100D of FIG. 7B to FIG. 7G, to achieve the purpose of current control, the current controlling layer 130 is a dielectric layer in some embodiments, but the invention is not limited in this regard. In some embodiments, the first type semiconductor layer 122 and the second type semiconductor layer 124 form a first p-n junction, the current controlling layer 130 and the first type semiconductor layer 122 form a second p-n junction, and the first conductive layer 140 and the second conductive layer 150 are configured to forward bias the first p-n junction while reverse bias the second p-n junction. In some embodiments, the first type semiconductor layer 122 and the second type semiconductor layer 124 form a p-n junction, and the current controlling layer 130 and the first type semiconductor layer 122 form a Schottky barrier. In some embodiments, the first type semiconductor layer 122 has the resistivity $\rho_1$, the current controlling layer 130 is a high resistivity layer which has a resistivity $\rho_h$, and $\rho_h > \rho_1$. In some embodiments, the first type semiconductor layer 122 is a p type semiconductor layer, the second type semiconductor layer 124 is an n type semiconductor layer, and the current controlling layer 130 is a hole blocking layer. In some embodiments, the first type semiconductor layer 122 is an n type semiconductor layer, the second type semiconductor layer 124 is a p type semiconductor layer, and the current controlling layer 130 is an electron blocking layer. The mechanism of controlling current of the current controlling layer 160 of FIG. 7F and FIG. 7G can be similar to one of the above embodiments of the current controlling layer 130 and therefore are not repeated here to avoid duplicity.

Figure 8A:
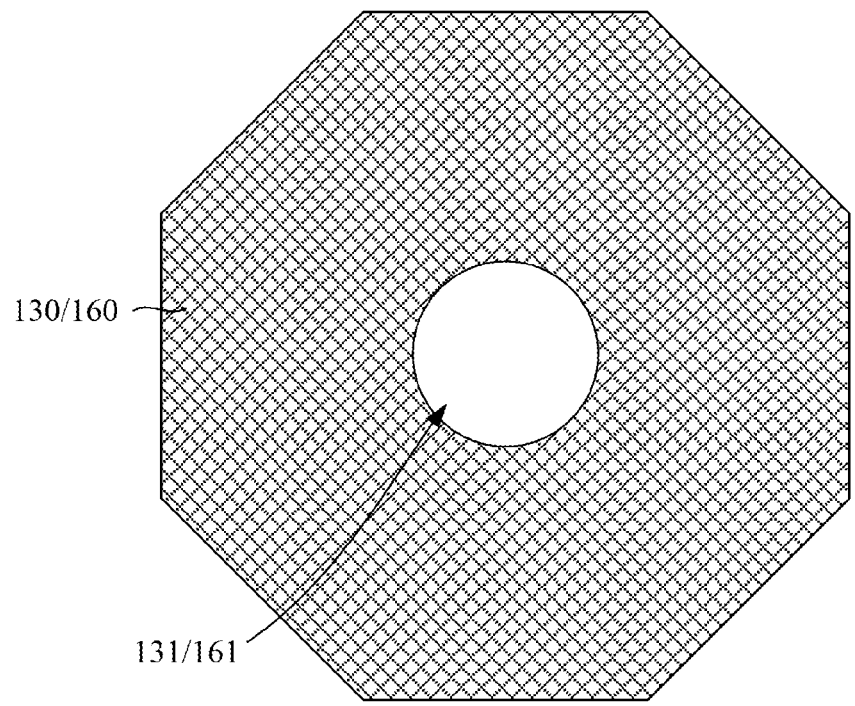
FIG. 8A is a plan view of a current controlling layer according to an embodiment of this invention.

FIG. 8A is a plan view of a current controlling layer 130 or 160 according to an embodiment of this invention. As shown in FIG. 8A, the current controlling layer 130 or 160 has only one opening 131 or 161 therein. More specifically, the opening 131 or 161 of FIG. 8A are circular in shape. However, the invention is not limited in this regard.

Figure 8B:
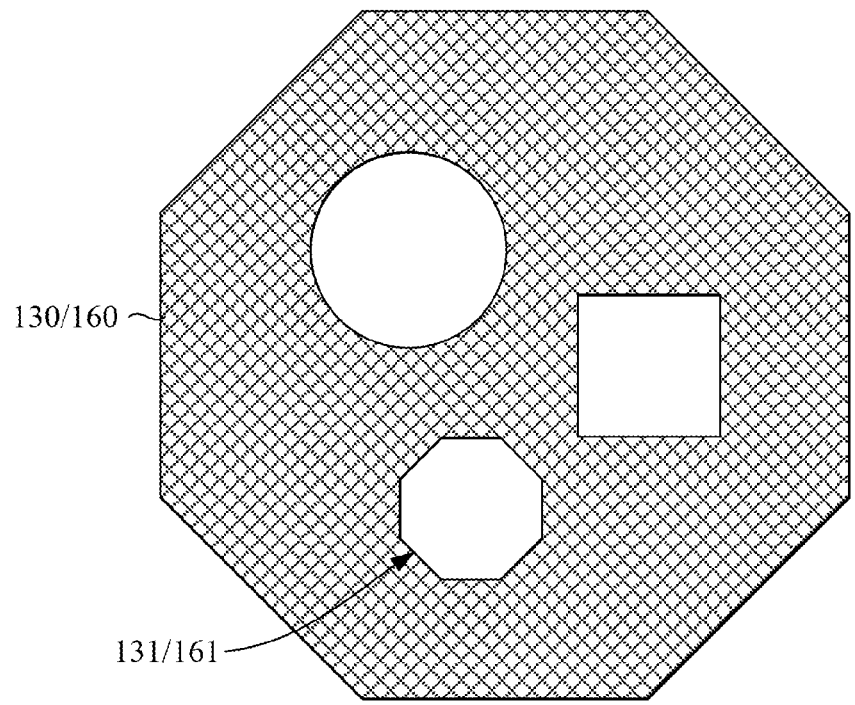
FIG. 8B is a plan view of a current controlling layer according to another embodiment of this invention.

FIG. 8B is a plan view of a current controlling layer 130 or 160 according to another embodiment of this invention. As shown in FIG. 8B, the current controlling layer 130 or 160 has a plurality of the openings 131 or 161 therein. The number of the openings 131 or 161 is in a range from 1 to 1000. The openings 131 or 161 have different shapes. In another embodiment, the openings 131 or 161 can the same shape, and the openings 131 or 161 can be arranged in an array.

Figure 8C:
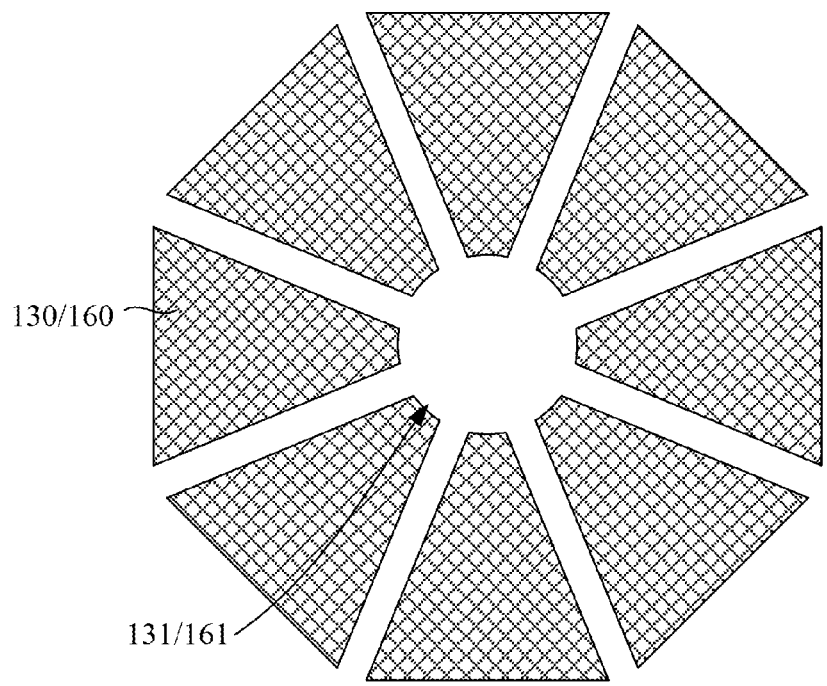
FIG. 8C is a plan view of a current controlling layer according to another embodiment of this invention

FIG. 8C is a plan view of a current controlling layer 130 or 160 according to another embodiment of this invention. As shown in FIG. 8C, the difference between the current controlling layer 130 or 160 of FIG. 8C and the current controlling layer 130 or 160 of FIG. 8A is that the opening 131 or 161 of FIG. 8C is an unenclosed opening. That is, the opening 131 or 161 of FIG. 8C is not necessary to isolate to the edge of the micro-LED. For example, the opening 131 or 161 is connected to the edge of the micro-LED by at least one groove. Other details regarding the current controlling layer 130 or 160 of FIG. 8C are similar to the current controlling layer 130 or 160 of FIG. 8A and therefore are not repeated here to avoid duplicity.

Figure 8D:
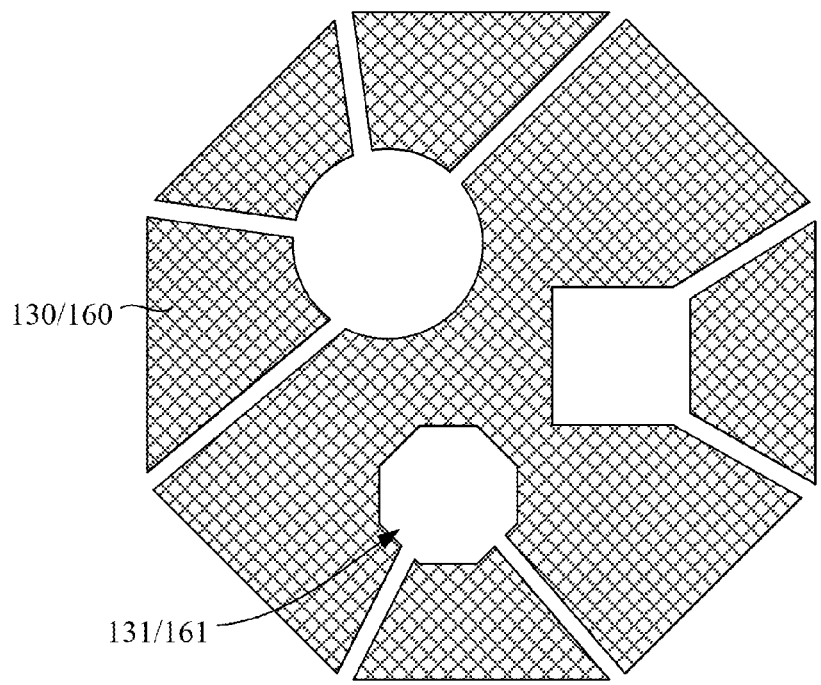
FIG. 8D is a plan view of a current controlling layer according to another embodiment of this invention.

FIG. 8D is a plan view of a current controlling layer 130 or 160 according to another embodiment of this invention. As shown in FIG. 8D, the difference between the current controlling layer 130 or 160 of FIG. 8D and the current controlling layer 130 or 160 of FIG. 8B is that each of the openings 131 or 161 of FIG. 8D is an unenclosed opening. That is, each of the openings 131 or 161 of FIG. 8D is not necessary to isolate to the edge. For example, each of the openings 131 or 161 is connected to the edge of the micro-LED by at least one groove. Other details regarding the current controlling layer 130 or 160 of FIG. 8D are similar to the current controlling layer 130 or 160 of FIG. 8B and therefore are not repeated here to avoid duplicity.

In addition, referring back to FIG. 3A, the first conductive layer 140 fully covers the openings 131 of the current controlling layer 130, but the invention is not limited in this regard. In some embodiments, the first conductive layer 140 partially covers the openings 131 of the current controlling layer 130. For example, the first conductive layer 140 covers the openings 131 without covering the grooves. Similarly, referring back to FIG. 5B, the second conductive layer 150 fully covers the openings 161 of the current controlling layer 160, but the invention is not limited in this regard. In some embodiments, the second conductive layer 150 partially covers the openings 161 of the current controlling layer 160. For example, the second conductive layer 150 covers the openings 161 without covering the grooves.

Figure 9:
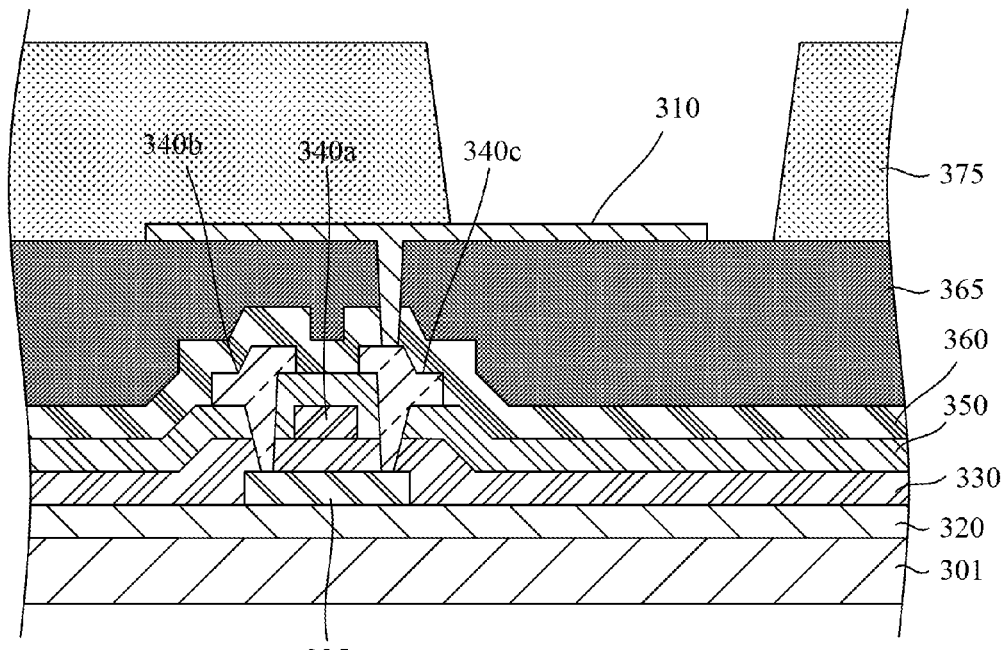
FIG. 9 is a cross-sectional views illustrating a receiving substrate according to an embodiment of the invention.

FIG. 9 is a cross-sectional view illustrating the receiving substrate 300 according to an embodiment of the invention. Referring to FIG. 9, a buffer layer 320 is formed on a substrate 301. A gate insulating layer 330 is formed on the entire surface of the substrate 301 having the semiconductor layer 325. A gate electrode 340*a*, an interlayer insulating layer 350, and source and drain electrodes 340*b* and 340*c* are formed on the gate insulating layer 330 to constitute a top gate structured thin film transistor (TFT). A passivation layer 360 and a planarization layer 365 are sequentially formed on or over an entire surface of the substrate 301, and a bonding electrode 310 is formed on the planarization layer 365 such that the bonding electrode 310 is electrically connected to the source or drain electrodes 340*b* and 340*c* by way of a via hole (not shown) formed through the passivation layer 360 and the planarization layer 365. A pixel defining layer 375 is then formed on or over the planarization layer 365 and/or a portion of the bonding electrode 310 to partially expose (or to expose a portion of) the bonding electrode 310.

Figure 10:
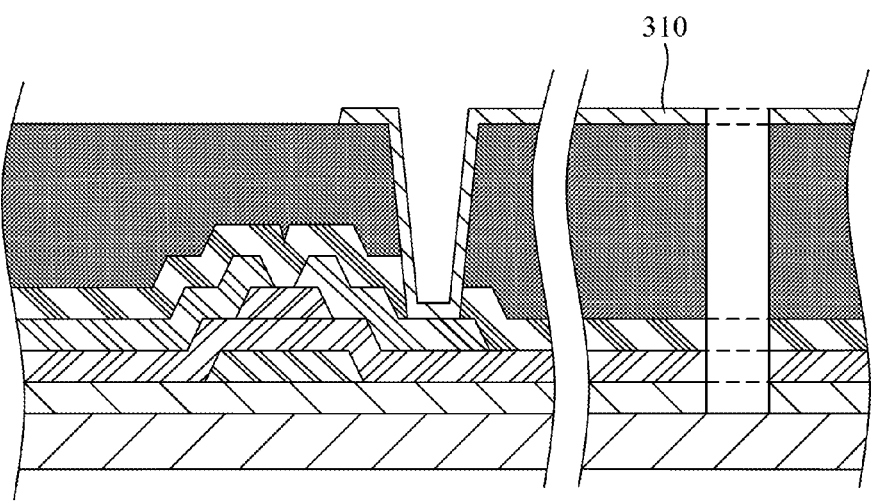
FIG. 10 is a cross-sectional view illustrating the receiving substrate according to another embodiment of the invention.

It is to be appreciated that the receiving substrate 300 with the top gate structured TFT illustrated in FIG. 9 is meant to be exemplary. FIG. 10 is a cross-sectional view illustrating the receiving substrate 300 according to another embodiment of the invention. Referring to FIG. 10, in the embodiment, the receiving substrate 300 is illustrated to include a bottom gate structured TFT, and the number of photomasks used to fabricate the receiving substrate 300 varies as needed. In some embodiments, a variety of suitable TFT of the receiving substrate 300 can be utilized in the invention.

Figure 11:
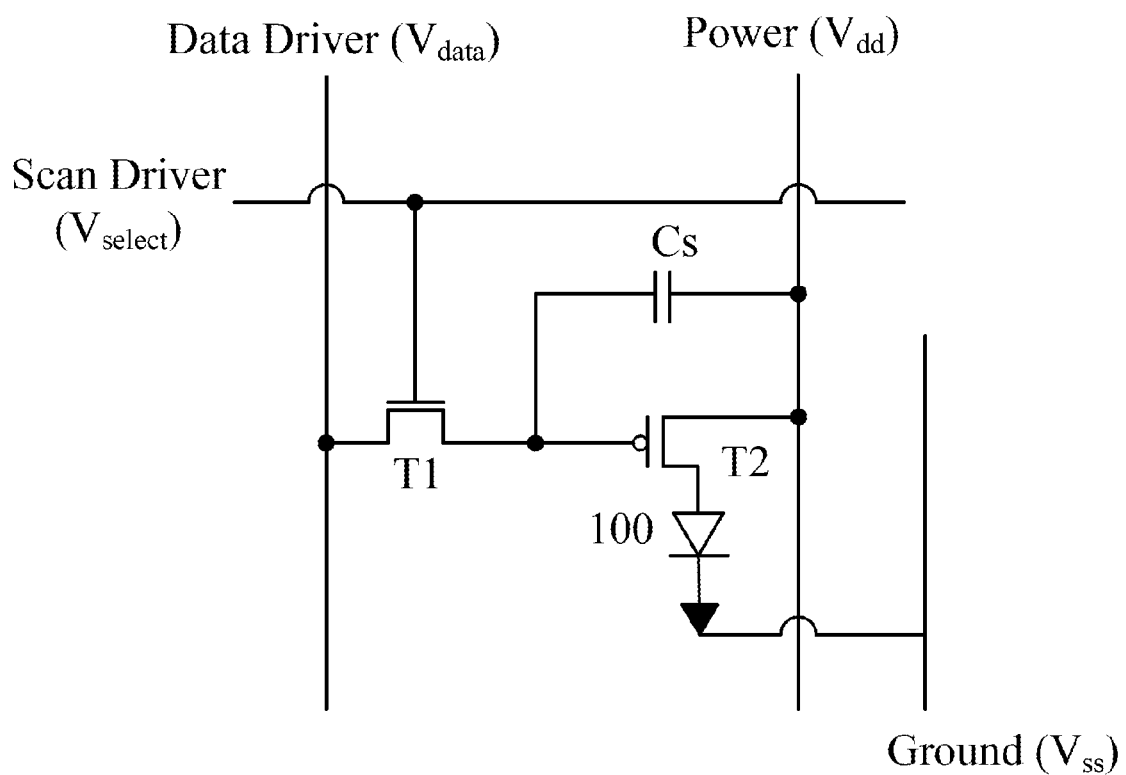
FIG. 11 is a circuit diagram of a subpixel with 2T1C circuitry in an active matrix display in accordance with an embodiment of the invention.

FIG. 11 is a circuit diagram of a subpixel with 2T1C circuitry according to an embodiment of the invention. In such an embodiment, the circuit can be used in the receiving substrate 300 illustrated in FIG. 9 or FIG. 10, which makes the receiving substrate 300 become an active matrix display substrate. The circuit includes a switching transistor T1, a driving transistor T2, a storage capacitor Cs, and a micro-LED 100. The transistors T1, T2 can be any type of transistor such as a thin film transistor. For example, the switching transistor T1 can be an n-type metal-oxide semiconductor (NMOS) transistor, and the driving transistor T2 can be a p-type metal-oxide semiconductor (PMOS) transistor. The switching transistor T1 has a gate electrode connected to a scan line $V_{select}$ and a first source/drain electrode connected to a data line $V_{data}$. The driving transistor T2 has a gate electrode connected to a second source/drain electrode of the switching transistor T1 and a first source/drain electrode connected to a power source $V_{dd}$. The storage capacitor Cs is connected between the gate electrode of the driving transistor T2 and the first source/drain electrode of the driving transistor T2. The micro-LED 100 has an anode electrode connected to a second source/drain electrode of the driving transistor T2 and a cathode electrode connected to a ground $V_{ss}$.

In operation, a voltage level scan signal turns on the switching transistor T1, which enables the data signal to charge the storage capacitor Cs. The voltage potential that stores within the storage capacitor Cs determines the magnitude of the current flowing through the driving transistor T2, so that the micro-LED 100 can emit light based on the current. It is to be appreciated that the 2T1C circuitry is meant to be exemplary, and that other types of circuitry or modifications of the traditional 2T1C circuitry are contemplated in accordance with embodiments of the invention. For example, more complicated circuits can be used to compensate for current distribution to the driver transistor and the micro device, or for their instabilities.

Figure 12:
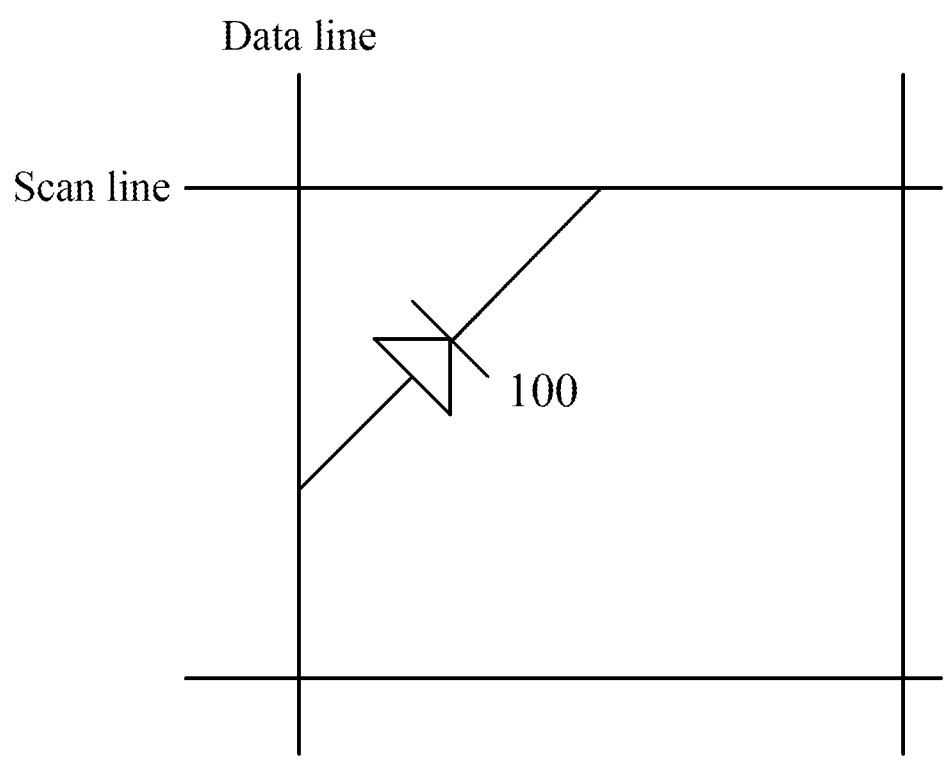
FIG. 12 is a circuit diagram of a subpixel according to an embodiment of the invention.

FIG. 12 is a circuit diagram of a subpixel according to an embodiment of the invention. In such an embodiment, the circuit used in the receiving substrate 300 makes the receiving substrate 300 become a passive matrix display substrate.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims is not intended to invoke the provisions of 35 U.S.C. §112, 6th paragraph.

What is claimed is:

1. A micro-light-emitting diode (micro-LED), comprising:
a first type semiconductor layer;
a second type semiconductor layer joined with the first type semiconductor layer;
a first current controlling layer joined with the first type semiconductor layer, the first current controlling layer having at least one opening therein;
a first electrode electrically coupled with the first type semiconductor layer; and
a second electrode electrically coupled with the second type semiconductor layer, wherein at least one of the first electrode and the second electrode has a light-permeable part, and a vertical projection of the first current controlling layer on said one of the first electrode and the second electrode overlaps with the light-permeable part, wherein the light-permeable part is transparent or semi-transparent.

2. The micro-LED of claim 1, wherein a vertical projection of the opening of the first current controlling layer on said one of the first electrode and the second electrode overlaps with the light-permeable part.

3. The micro-LED of claim 1, wherein the first current controlling layer is a dielectric layer.

4. The micro-LED of claim 1, wherein the first type semiconductor layer and the second type semiconductor layer form a first p-n junction, the first current controlling layer and the first type semiconductor layer form a second p-n junction, and the first electrode and the second electrode are configured to forward bias the first p-n junction while reverse bias the second p-n junction.

5. The micro-LED of claim 1, wherein the first type semiconductor layer is a p type semiconductor layer, the second type semiconductor layer and the first current controlling layer are n type semiconductor layers.

6. The micro-LED of claim 1, wherein the first type semiconductor layer is an n type semiconductor layer, the second type semiconductor layer and the first current controlling layer are p type semiconductor layers.

7. The micro-LED of claim 1, wherein the first type semiconductor layer and the second type semiconductor layer form a p-n junction, the first current controlling layer and the first type semiconductor layer form a Schottky barrier.

8. The micro-LED of claim 7, wherein the first current controlling layer is a plasma-treated portion of the first type semiconductor layer.

9. The micro-LED of claim 1, wherein the first type semiconductor layer has a resistivity $\rho_1$, the first current controlling layer is a high resistivity layer which has a resistivity $\rho_h$, and $\rho_h > \rho_1$.

10. The micro-LED of claim 1, wherein the first current controlling layer is an electron blocking layer, and the first type semiconductor layer is an n type semiconductor layer.

11. The micro-LED of claim 1, wherein the first current controlling layer is a hole blocking layer, and the first type semiconductor layer is a p type semiconductor layer.

12. A micro-LED display, comprising:
a substrate having a bonding electrode; and
a micro-LED of claim 1, wherein a combination of the first type semiconductor layer, the second type semiconductor layer, the first current controlling layer, the first electrode, and the second electrode is joined with the bonding electrode, the first type semiconductor layer is distal to the substrate, and the second type semiconductor layer is proximal to the substrate.

13. A micro-LED display, comprising:
a substrate; and
a micro-LED of claim 1, wherein a combination of the first type semiconductor layer, the second type semiconductor layer, the first current controlling layer, the first electrode, and the second electrode is joined with the substrate, the first type semiconductor layer is distal to the substrate, the second type semiconductor layer is proximal to the substrate, and the second electrode serves as a bonding electrode of the substrate.

14. The micro-LED of claim 1, wherein the first current controlling layer is transparent or monochrome transparent.

15. The micro-LED of claim 1, wherein the first current controlling layer is reflective or monochrome reflective.

16. A micro-LED display, comprising:
a substrate having a bonding electrode; and
a micro-LED of claim 1, wherein a combination of the first type semiconductor layer, the second type semiconductor layer, the first current controlling layer, the first electrode, and the second electrode is joined with the bonding electrode, the first type semiconductor layer is proximal to the substrate, and the second type semiconductor layer is distal to the substrate.

17. A micro-LED display, comprising:
a substrate; and
a micro-LED of claim 1, wherein a combination of the first type semiconductor layer, the second type semiconductor layer, the first current controlling layer, the first electrode, and the second electrode is joined with the substrate, the first type semiconductor layer is proximal to the substrate, the second type semiconductor layer is distal to the substrate, and the first electrode serves as a bonding electrode of the substrate.

18. The micro-LED of claim 1, wherein said one of the first electrode and the second electrode having the light-permeable part is wholly transparent.

19. The micro-LED of claim 1, wherein the first current controlling layer has a plurality of the openings therein.

20. The micro-LED of claim 1, wherein the first electrode is electrically coupled with the first type semiconductor layer through the opening of the first current controlling layer.

21. The micro-LED of claim 20, wherein the first type semiconductor layer has a resistivity $\rho_1$ and a thickness $t_1$, the second type semiconductor layer has a resistivity $\rho_2$ and a thickness $t_2$, and $$\sqrt{\frac{t_1}{\rho_1}} < \sqrt{\frac{t_2}{\rho_2}}.$$

22. The micro-LED of claim 20, further comprising:
a second current controlling layer joined with the second type semiconductor layer and having at least one opening therein, wherein the second electrode extends through the opening of the second current controlling layer to be electrically coupled with the second type semiconductor layer.

23. The micro-LED of claim 20, wherein the first electrode at least partially covers the opening of the first current controlling layer.

24. The micro-LED of claim 1, wherein the second electrode at least partially contacts the second type semiconductor layer.

25. The micro-LED of claim 1, wherein the first electrode at least partially contacts the first type semiconductor layer.

26. The micro-LED of claim 1, further comprising:
an active layer disposed between the first type semiconductor layer and the second type semiconductor layer, wherein the first current controlling layer is disposed between at least a part of the first type semiconductor layer and the active layer.

27. The micro-LED of claim 26, wherein the first current controlling layer contacts the active layer.

28. The micro-LED of claim 26, wherein the first current controlling layer is disposed in the first type semiconductor layer without contacting the active layer.

29. The micro-LED of claim 26, further comprising a second current controlling layer disposed between at least a part of the second type semiconductor layer and the active layer.

30. The micro-LED of claim 26, further comprising:
a second current controlling layer joined with the second type semiconductor layer and having at least one opening therein, wherein the second electrode extends through the opening of the second current controlling layer to be electrically coupled with the second type semiconductor layer.

* * * * *